(12) United States Patent
Driesel et al.

(10) Patent No.: US 8,148,986 B2
(45) Date of Patent: Apr. 3, 2012

(54) HF ANTENNA SYSTEM FOR MAGNETIC RESONANCE MEASUREMENTS

(75) Inventors: Wolfgang Driesel, Sandersdorf (DE); Toralf Mildner, Leipzig (DE); Harald Moeller, Leipzig (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 853 days.

(21) Appl. No.: 11/659,299

(22) PCT Filed: Aug. 4, 2005

(86) PCT No.: PCT/EP2005/008472
§ 371 (c)(1),
(2), (4) Date: Oct. 2, 2008

(87) PCT Pub. No.: WO2006/015803
PCT Pub. Date: Feb. 16, 2006

(65) Prior Publication Data
US 2009/0096553 A1    Apr. 16, 2009

(30) Foreign Application Priority Data
Aug. 5, 2004 (EP) .................................. 04018597

(51) Int. Cl.
*G01V 3/00* (2006.01)
(52) U.S. Cl. ........ 324/318; 324/300; 335/216; 600/422; 600/418; 343/700 MS
(58) Field of Classification Search .................. 324/300
See application file for complete search history.

(56) References Cited

U.S. PATENT DOCUMENTS
4,775,837 A    10/1988   Roschmann
5,270,656 A *  12/1993   Roberts et al. ................. 324/318
(Continued)

FOREIGN PATENT DOCUMENTS
DE       10119323 A   10/2002
(Continued)

OTHER PUBLICATIONS

Bahl et al., "A Designers Guide to Microstrip Line", Microwaves, p. 174-179, 1977.*

(Continued)

*Primary Examiner* — B Shrivastav
*Assistant Examiner* — Benjamin M Baldridge
(74) *Attorney, Agent, or Firm* — Drinker Biddle & Reath LLP

(57) ABSTRACT

The invention relates to an HF-antenna system for carrying out and/or detecting a magnetic resonance in an object exposed to a main magnetic field which orients the object spins in a desired longitudinal direction (z) comprising at least one first antenna element (1) provided with several conducting sections (11, 12, 13, 14) which lead a high-frequency alternating current and extend from the common top to a base area in the form of separate claws in such a way that the testable object containing a volume of interest is enveloped in a helmet manner. Said invention is characterized in that each conducting section (11, 12, 13, 14) is embodied in the form of a HF (HL) line for electromagnetically connecting a wave propagating in a TEM mode or in an quasi-TEM mode with the spins of the testable object to be enveloped and the electrical length the terminals of the HF (HL) lines are selected in such a way that the magnetic resonance frequency waves are produced therein.

25 Claims, 11 Drawing Sheets

U.S. PATENT DOCUMENTS

| | | | | |
|---|---|---|---|---|
| 5,515,855 | A * | 5/1996 | Meyer et al. | 600/422 |
| 5,519,406 | A * | 5/1996 | Tsukamoto et al. | 343/700 MS |
| 5,557,247 | A | 9/1996 | Vaughn, Jr. | |
| 5,600,331 | A * | 2/1997 | Buralli | 343/700 MS |
| 6,420,871 | B1 * | 7/2002 | Wong et al. | 324/318 |
| 6,711,430 | B1 * | 3/2004 | Ferris et al. | 600/417 |
| 7,023,209 | B2 * | 4/2006 | Zhang et al. | 324/318 |
| 7,250,764 | B2 * | 7/2007 | Tropp | 324/318 |
| 2002/0079996 | A1 * | 6/2002 | Zhang et al. | 335/216 |
| 2002/0180439 | A1 * | 12/2002 | Lee | 324/318 |
| 2004/0030238 | A1 * | 2/2004 | Vaughan | 600/418 |
| 2005/0264291 | A1 * | 12/2005 | Vaughan et al. | 324/318 |
| 2005/0275403 | A1 * | 12/2005 | Pinkerton et al. | 324/318 |
| 2007/0182414 | A1 * | 8/2007 | Morich et al. | 324/318 |

FOREIGN PATENT DOCUMENTS

| | | |
|---|---|---|
| EP | 0758092 A | 2/1997 |
| GB | EP 0148566 A1 * | 7/1985 |
| WO | WO03/058283 A | 7/2003 |

OTHER PUBLICATIONS

Bader et al., "A wide frequency range antenna system for multinuclear MRS and MRI", *SMRM 6<sup>TH</sup> Annual Meeting*, New York, p. 406 (1987).

Bahl et al., "A designer's guide to microstrip line", *Microwaves*, p. 174-179 (1977).

Bogdanov et al., "Coupled microstrip line transverse electromagnetic resonator module for high-field magnetic resonance", *Magn. Reson. Med.* 47:579-593 (2002).

Driesel et al. "A New Helmet Coil Concept Using Strip Lines", *Proc. Intl. Soc. Mag. Reson. Med.* 13:948 (2005).

Driesel et al., "3-Tesla-helmet coil customization to allow for more general fMRI studies", Magma 16(7):163 (2003).

Edelstein et al., "The relative sensitivity of surface coils to deep lying tissues", *SMRM 4<sup>th</sup> Annual Meeting*, San Francisco, p. 964-965 (1985).

Hayes et al., "An efficient, highly homogeneous radiofrequency coil for whole-body NMR-imaging at 1,5-T.", *J. Magn. Reson.* 63:622-628 (1985).

Itoh, T., "Overview of quasi-planar transmission lines", *IEEE Trans. Microwave Theory Tech* 37:275-280 (1989).

Jackson, J.D., "Klassische Elektrodynamik", W. de Gruyter, Berlin (1983).

Lee et al., "Planar strip array (PSA) for MRI", *Magnetic Resonance in Medicine* 45(4):673-683 (2001).

Lee et al., "Lumped-element planar strip array (LPSA)", *Magn. Reson. Med.* 51:172-183 (2004).

Meyer et al., Sensitivity-Enhanced Echo-Planar MRI at 1.5T using a 5x5 Mesh Dome Resonator, *MRM* 36:606-612 (1996).

Meyer et al., "A Quadrature 5x5 Mesh Dome Resonator for Head Imaging and Spectroscopy", *Proc. Soc. Imag. Reson.* 2 (1994).

Meyer et al., "A 3x3 mesh Two-Dimensional Ladder Network Resonator for MRI of the Human Head", *Journal of magnet Resonance*, Series B 107:19-24 (1995).

Mildner et al., "Functional perfusion imaging using continuous arterial spin labeling with separate labeling and imaging coils at 3 T.", *Magn. Reson. Med.* 49:791-795 (2003).

Mildner et al., "Functional perfusion imaging using continuous arterial spin labeling with separate labeling and imaging coils at 3 Tesla", *Proc. Intl. Soc. Mag. Reson. Med.* 10 (2002).

Schnal, M., "Probes tuned to multiple frequencies for in-vivo NMR", in: *NMR Basic Principles and Progress* 26:33-63, pub. Springer-Verlag, Heidelberg (1992).

Schnieder et al., "Model of thin-film microstrip line for circuit design", *IEEE Trans. Microwave Theory Tech* 49:104-110 (2001).

Silva et al., "Hardware Considerations for Functional Magnetic Resonance Imaging", *Concepts Magn. Reson. A*, 16:35-49 (2003).

Trampel et al., "Continuous arterial spin labeling using a local magnetic field gradient coil", *Magn. Reson. Med.* 48:543-546 (2002).

Vaughan et al., "High frequency surface coils for clinical NMR imaging and spectroscopy", *SMRM 21th Annual Meeting*, New York, p. 1332 (1993).

Vaughan et al.., "High frequency volume coils for clinical NMR imaging and spectroscopy", *Magn. Reson. Med.* 32:206-218 (1994).

Zaharchuk et al., "Multislice perfusion and perfusion territory imaging in humans with separate label and image coils", *Magn. Reson. Med.* 41:1093-1098 (1999).

Zhang et al. "A microstrip transmission line volume coil for human head MR imaging at 4T", *Journal of Magnetic Resonance* 161(2):241-251 (2003).

\* cited by examiner

State of the art

HF ANTENNA SYSTEM FOR MAGNETIC RESONANCE MEASUREMENTS

FIELD OF THE INVENTION

The invention relates to an HF antenna system for exciting and/or detecting magnetic resonance in a measuring volume of interest of an object to be examined that is exposed to a main magnetic field that orients the spins of the object in a desired longitudinal direction. The primary areas of application of the invention are magnetic resonance imaging (MRI) and magnetic resonance spectroscopy (MRS).

BACKGROUND OF THE INVENTION

When indicating and assessing the state of the art in the following description, appropriate citations in the generally accessible literature are cited:
[1] R. Bader et al., "A wide frequency range antenna system for multi-nuclear MRS and MRI.", SMRM, $6^{th}$ Annual Meeting, New York 1987, p. 406;
[2] P. K. Roschmann, "Surface coil for high-frequency magnetic fields for magnetic resonance examinations.", U.S. Pat. No. 4,775,837;
[3] J. T. Vaughan et al., "High-frequency surface coils for clinical NMR imaging and spectroscopy.", SMRM $12^{th}$ Ann. Meeting, New York 1993, p. 1332;
[4] C. E. Hayes et al., "An efficient, highly homogenous radiofrequency coil for whole-body NMR-imaging at 1,5-T.", J. Magn. Reson. 1985, 63: 622-628;
[5] W. A. Edelstein et al., "The relative sensitivity of surface coils to deep lying tissues." SMRM, $4^{th}$ Annual Meeting, San Francisco 1985, pp. 964-965;
[6] Silva and Merkle, "Hardware considerations for functional magnetic resonance imaging." Concepts Magn. Reson. A, 2003; 16: 35-49;
[7] T. Mildner et al., "Functional perfusion imaging using continuous arterial spin labeling with separate labeling and imaging coils at 3 T." Magn. Reson. Med. 2003, 49: 791-795;
[8] J. T. Vaughan et al., "High-frequency volume coils for clinical NMR imaging and spectroscopy.", Magn. Reson. Med. 1994, 32: 206-218;
[9] J. T. Vaughan, "Radiofrequency volume coil.", U.S. Pat. No. 5,557,247, 1996;
[10] J. T. Vaughan, "HF-coil for imaging system and use therein.", U.S. Pat. 60/135,269;
[11] G. Bogdanov and R. Ludwig, "Coupled microstrip line transverse electromagnetic resonator module for high-field magnetic resonance.", Magn. Reson. Med. 2002, 47: 579-593;
[12] P. Bottomley, "MRI tunable antenna and system.", WO 03/0582283;
[13] R. F. Lee et al., "Lumped-element planar strip array (LPSA).", Magn. Reson. Med. 2004, 51: 172-183;
[14] R. F. Lee et al., "Planar strip array (PSA) for MRI.", Magn. Reson. Med. 2001; 45: 673-683;
[15] W. Driesel and H. Merkle, "3-Tesla-helmet coil customization to allow for more general fMRI studies." MAGMA 2003, 16 (Suppl. 7); 163;
[16] X. Zhang et al., "Microstrip RF surface coil design for extremely high-field MRI and spectroscopy." Magn. Reson. Med. 2001; 46: 443-450;
[17] J. D. Jackson, "Klassische Elektrodynamik." W. de Gruyter, Berlin 1983;
[18] I. J. Bahl and D. K. Trivedl, "A designer's guide to microstrip line." Microwaves, May 1997, pp. 174-179;
[19] F. Schnieder and W. Heinrich, "Model of thin-film microstrip line for circuit design." IEEE Trans. Microwave Theory Tech. 2001, 49: 104-110;
[20] T. Itoh, "Overview of quasi-planar transmission lines." IEEE Trans. Microwave Theory Tech. 1989, 37: 275-280;
[21] G. Zaharchuk et al., "Multislice perfusion and perfusion territory imaging in humans with separate label and image coils." Magn. Reson. Med. 1999; 41: 1093-1098;
[22] R. Trampel et al., "Continuous arterial spin labeling using a local magnetic field gradient coil." Magn. Reson. Med. 2002; 48: 543-546.
[23] M. D. Schnall, "Probes tuned to multiple frequencies for in-vivo NMR." In: NMR Basic Principles and progress, 26: 33-63, Springer, Heidelberg, 1992.

These citations are designated in brackets [ ] in the text of the description by indicating the above reference numerals.

Since the arrangements for exciting and/or detecting magnetic resonance in the beginning of magnetic resonance technology had the shape of conductive loops wound similar to coils, they are still often designated today as coils, even if their actual design has no similarity with what is generally understood by a coil. In the text presented here the more comprehensive designation "antenna" is preferred, which in the meantime has also become customary in parts of the professional literature.

The HF field in the close range, that is, ranges of the examined object in the direct surroundings of the antenna (distances up to one wavelength) is of particular interest as regards the design of the HF antenna. The so-called far field should be avoided to the extent possible since it only results in undesired interactions with the surroundings. There is a broad spectrum for using such antennas in the medical area, e.g., when investigating the human brain. However, the invention can also be used with advantage in other areas of MRI and MRS and for other objects.

In MRI or MRS the object to be examined is brought into a strong static magnetic field ($B_0$ field). If the object to be examined contains atomic nuclei with a nuclear spin different from zero the spins and the magnetic nuclear moments associated with them are oriented in the $B_0$ field and the splitting of the nuclear spin energy level that degenerated in the field-free space takes place. The nuclear moments execute a precessional movement around the direction of the static magnetic field $B_0$. The frequency of the precession (Larmor frequency $\omega$) is proportional to the $B_0$ field strength:

$$\Omega = \gamma * B_0.$$

The symbol "*" designates here and in the following the operator for multiplication. The proportionality factor $\gamma$ is the gyromagnetic ratio of the atomic nucleus examined. The Larmor frequency is in a range of approximately 1 MHz to 1 GHz as a function of the $B_0$ field strength. A macroscopic magnetization that is directed parallel to the direction of the static field $B_0$ in thermal equilibrium results as the vectorial sum, normalized to the volume, of the magnetic nuclear moments in the examined object. In order to deflect the magnetization, that is, in order to generate a measurable magnetic resonance signal, electromagnetic HF power is radiated in pulses or also continuously into the examined object with the Larmor frequency $\omega$ by means of an HF transmitter and an HF antenna. When receiving, the voltage induced in the antenna is measured as response signal of the excited spins. Conclusions can be drawn about the physical and chemical structure of the object by evaluating of this "magnetic resonance signal". In this manner morphological, metabolic and functional examinations are possible in biomedical applications. If a $B_0$ field gradient is superposed on the homogenous $B_0$ field the Larmor frequency becomes location-dependent. This quality is utilized in MRI for location coding (site coding).

The desired interaction between the spin of the examined object and the HF antenna results only for those locations in the examined object where the magnetic alternating field has a component orthogonal to the z direction, that is, orthogonal to the direction of the $B_0$ field. This component is designated as the "$B_1$ field".

The customary transmitting/receiving antennas for magnetic resonance can be roughly subdivided into surface- and volume antennas. The surface antennas also include, among other things and in addition to simple conductive loops, loop-shaped structures of waveguides, see [1], [2], [3].

Typical representatives of volume antenna are, among others, saddle coils, solenoids and birdcage resonators. Combinations of surface antennas and volume antennas are also known. Volume antennas that generate a very homogenous HF field ($B_1$ field) are in particular the birdcage resonators, see [4].

All these antenna types have disadvantages in their application. Thus, a very homogenous illumination of the object can be achieved with a volume antenna; however, a lesser sensitivity as regards the magnetic resonance signal is gained. In contrast thereto, surface antennas have a very high sensitivity to the magnetic resonance signal in areas close to the surface, that is, at a slight depth vertically to the antenna plane, see [5]. However, the illumination takes place very inhomogeneously and decreases rapidly with increasing distance. Surface antennas can be advantageously used for receiving the magnetic resonance signal approximately down to a depth corresponding to the diameter of the antenna.

All efforts to obtain an optimal antenna design are based on the desire to create an HF antenna that is as sensitive as possible only in the area of interest (therefore, in the "measuring volume"), that is, that excites the nuclei in the examined object only there and receives magnetic resonance signals only from there. It would be ideal if the illumination is as homogenous as possible in this range and the antenna has a high sensitivity for the actual measuring volume. These two requirements are mutually exclusive. As is known, in the direct vicinity of conductors the magnetic field is very inhomogeneous but the receiving efficiency S regarding the magnetic resonance signal is high:

$$S \sim B(r)/I,$$

in which B(r) designates the magnetic field at distance r from the conductor and I designates the current through the conductor. The symbol "~" designates "proportional to" and the symbol "/" designates here the operator for division. Inverse conditions are found at a greater distance from the conductors.

This is a problem if different locations in the measuring volume have different distances from the antenna. Thus, the design of HF antennas always represents a compromise between the two competing viewpoints. It is apparent from this that HF antennas must be optimized for corresponding applications.

A known measure to this end is to adapt the antenna in its form to the object to be examined in such a manner that the volume area of interest of the object is detected as well as possible by the magnetic field in the close range. Thus, anatomically adapted antennas were developed for investigating the human brain that can surround a human head like a helmet, see [6]. However, such a "helmet antenna" has certain disadvantages in its known embodiment, as will be explained in the following using a figure of the attached drawings.

The antenna according to FIG. 1 contains, in its simplest shown form, a ring-shaped conductive base R subdivided into four areas by four condensers CR distributed uniformly over its circumference. Halfway between every two adjacent ring condensers CR one of four conductive holders X1, X2, Y1, Y2 offset by 90° empties in, which are also subdivided for their part by condensers $C_B$ for tuning purposes and to avoid phase shifts. The two diametrically opposite holders X1 and X2 are connected at the other end by a first feed connection x1-x2. The other two diametrically opposite holder halves Y1 and Y2 are connected by a second feed connection y1-y2. Each pair of two diametrically opposite holders forms a circuit that is closed via base ring R.

Base ring R, the first pair of holders X1, X2 and the second pair of holders Y1, Y2 act as three partial antennas. Since these three partial antennas are arranged in three planes vertical to each other a decoupling between the three partial antennas can be achieved given an exactly symmetrical construction of the helmet antenna relative to the z axis. Only the two X and Y pairs of holders substantially generate a magnetic field vertically to the z axis, that is, an active $B_1$ field, and are therefore active as concerns the magnetic resonance. Furthermore, a strong gradient of the $B_1$ field, measured in the $B_0$ direction (z direction) results in the case of the described helmet antenna because on account of the geometric form of the pairs of holders this field is much weaker in the area of the antenna base, where the holders are located further apart from each other, than in the area of the antenna top. This has the result that examinations with a usable signal-to-noise ratio (SNR) are possible only in the upper area of the brain.

In addition to this disadvantage there is yet a further problem that is based in the described helmet antenna concept. As was explained above, these antenna concepts use a ring-shaped base for the current flow between the two ends of each pair of holders far from the top. This results in a serious disadvantage that should be explained for one pair of holders. The explanation also logically applies to the pair of holders offset by 90°. The current penetrating from the one holder into the ring-shaped base flows half and half into the two parts of the ring-shaped base further, where it generates an additional magnetic field. This magnetic field is cancelled on account of the differing direction of current flow in the ring-shaped base in the area of the axis of symmetry of the antenna; however, outside of this axis the compensation of this field is incomplete and an additional magnetic field is generated in the z direction. Though this field is substantially not relevant for the generation of magnetic resonance signals, but considering the specific absorption rate (SAR), it definitely influences the total balance negatively and must also be taken into the calculation when coupling to other antennas.

A coupling to other antennas can occur in various customary antenna combinations such as are used, e.g., for "whole-body MRI" or for "continuous arterial spin labeling" (CASL). This last-named technology is used for perfusion measuring, see [7]. In it, in addition to the antenna structure detecting the brain an additional antenna structure is used as a so-called "label antenna" (conventionally a surface coil) on the patient's neck (or of the test person or test animal) in order to magnetically mark the blood at the carotid artery (by inverting the nuclear magnetization in the blood) in order to represent its subsequent local distribution in the brain by MRI. The latter takes place by means of the antenna detecting the brain.

Since the magnetic field generated from the ring-shaped base of a helmet antenna also has components vertical to the z axis, a superpositioning with the $B_1$ field generated by the holders occurs at least in areas outside of the axis of symmetry and therefore a deterioration of the homogeneity of this $B_1$ field occurs. Furthermore, the currents of the two holders also result in a significant stray field outside of the brain, which may amplify the coupling to other antennas (e.g., label antennas).

SUMMARY OF THE INVENTION

The present invention has the objective of providing an HF antenna system for magnetic resonance measurements such that when an object to be examined is surrounded in a helmet-like manner, the previously required ring conductor can be dispensed with. This objective is solved in accordance with the invention by the features indicated in claim 1.

Accordingly, the invention is realized with an HF antenna system for exciting and/or detecting the magnetic resonance in an object to be examined that is exposed to a main magnetic field $B_0$ that orients the spins of the object in a desired longitudinal direction z with at least a first antenna structure designed as a helmet antenna in that it comprises a plurality of conducting sections that are adapted to conduct high-frequency alternating current and that extend from a common vertex area spreading out like claws to a base area in order to surround like a helmet the part of the object to be examined and containing the volume of interest. The antenna system in accordance with the invention differs from the known antenna systems of this kind in that each conducting section is designed as an HF line for conducting a guide wave propagating in TEM mode or in a quasi TEM mode in electromagnetic coupling with spins of the examined object to be surrounded, and that the electrical length and the terminations of the HF lines are selected in such a manner that standing waves result at the frequency of the magnetic resonance in the HF lines.

The helmet antenna designed in accordance with the invention can be tuned resonant as regards one or more Larmor frequencies. It has significant advantages over the state of the art. In the first place, the ring conductor required in known helmet antennas and the problems associated with it are eliminated. Thus, the undesirable coupling with other antenna structures such as, e.g., with a label antenna, which is used in the above-mentioned CASL process for perfusion measuring, is minimized. Furthermore, a simpler design, increased structural freedom for audiovisual and other supplementary apparatuses and a lesser SAR load result.

A further advantage is a surprising flexibility as regards the illumination of the volume area of interest within the examined object. Thus, in a special embodiment of the invention the electrical length and the termination as well as parameters of the bodily structure of each HF line can be dimensioned in such a manner that the magnetic alternating field of the standing guide wave along the length of the HF lines has an intensity profile at the magnetic resonance frequency at which intensity profile the coupling with the spins of the examined object concentrates on the particular volume area of interest that is, is "focused", when the HF lines surround the examined object like a helmet. The degree of effectiveness at the targeted illumination of the volume area of interest, that is often only a part of the entire surrounded volume, can be optimized by this "focusing"; stray fields and undesirable couplings with possibly present other components of the magnetic resonance measuring system can be minimized.

The design of the helmet antenna in accordance with the invention is furthermore distinguished by a $B_1$ field gradient in the z by direction, which gradient can be modified as desired. Thus, in a special embodiment of the invention the electrical length and the termination as well as parameters of the bodily structure of each HF line can be dimensioned in such a manner that the gradient of the component, measured in said longitudinal direction, of the resulting magnetic alternating field of the guide waves, that is, the "$B_1$ gradient", has a desired course over the volume area of interest.

The desired course of the $B_1$ gradient can be such, e.g., that this gradient can be used for location coding instead of a magnetic field gradient imposed from the outside by a separate gradient coil. However, the dimensioning can also be selected so that the $B_1$ gradient is minimal, that is, a maximal homogeneity of the $B_1$ field is achieved in the volume of interest. In this manner a $B_1$ gradient conditioned by the geometry of the conducting sections can be at least partially compensated in the volume to be measured. This can succeed, e.g., by dimensioning the electrical length and of the termination of each HF line in such a manner that at the magnetic resonance frequency the intensity of the alternating current on the HF line continuously increases from the vertex area to the base area.

The HF lines used can basically be of any type, e.g., coaxial lines, two-wire lines, or strip lines. In a preferred embodiment of the invention the HF lines are designed as strip lines.

The invention is based on the known fact that HF energy is conducted along an HF line in the form of guide waves and that standing waves develop if the line does not terminate with an ohmic resistance that is equal to the wave resistance of the line. The guide waves can be real TEM waves in the case of which the electrical and magnetic field lines run strictly transversally (precisely orthogonally) to the line length; such waves result, e.g., in coaxial lines. However, the guide waves can also be so called "quasi-TEM-waves" like those that occur in particular in strip lines and in the case of which the fields also have weak components in the longitudinal direction of the line. These weak components can be ignored in the instances treated here so that the same considerations as for real TEM waves apply for quasi-TEM-waves in sufficient approximation.

The use of HF antennas for magnetic resonance measurements that contain sections of HF lines (transmission lines) as waveguides for conducting guide waves is known, see [8], [9], [10]. For this, specially terminated coaxial cable pieces are used for realizing resonance circuits. Building up such line resonator antennas in strip conductor technology is also known, see [11], [12], [13].

However, it was not obvious to gain the recognition from this state of the art that the use of HF lines can solve the problems described further above like those occurring especially with the previously known helmet antennas on account of the ring conductor. It could not have been predicted in view of the previous development path of helmet antennas that there was a way at all to make do without the problematic ring conductor in a helmet antenna. Furthermore, it could also not have been readily recognized in view of the above-cited state of the art that the focusing of the $B_1$ field on the volume area of interest can be achieved by a selective dimensioning and terminating of HF lines in magnetic resonance antenna arrangements. The fact that standing guide waves obligatorily bring about a non-uniform ("wavy") current distribution along the HF lines and therewith a non-uniform field distribution tended to be viewed previously as problematic. Thus, the previous attempts when using HF lines were rather directed to holding the distribution of current as uniform as possible over the length of the entire antenna arrangement either by ohmic termination with the wave resistance or by spatially parallel-running HF lines with alternating short-circuit termination and open termination, see, e.g., [12] and [14]. This expense dictated by the state of the art was an additional deterrent to using HF lines in practice as antenna elements for magnetic resonance. The invention frees itself from this deterrent on account of the recognition that a non-uniform distribution of current does not always have to be problematic, especially not in the case of an anatomically adapted antenna such as a helmet antenna, but rather can even be utilized with advantage, if desired.

The parameters of the bodily structure of HF lines whose dimensioning can be included in accordance with the invention in the volume of interest for obtaining the particular desired field distribution include in particular:
  a) geometric length, adjustable by selection of the dielectric and/or by discrete reactance elements on the HF line;
  b) contour and/or curvature course;
  c) in the case of strip lines, width and number of the conductor strips along the line and the thickness of the dielectric.

The field distribution can be additionally influenced by location-dependent variation of several of these structural parameters along the HF line. Thus, the dielectric constant of the dielectric and, in the case of strip lines, the thickness of the dielectric and the geometric course of the conductor strips along the line can follow a function that contributes to the attainment of the desired field distribution.

In a special embodiment of the invention the HF antenna system additionally contains a second antenna structure as label antenna formed from one or several HF lines. Preferably, the HF lines of the label antenna are also formed as concerns their electrical length, termination and bodily structure in accordance with the above-mentioned viewpoints in order to achieve a desired field distribution in the volume that should be excited to magnetic resonance by the label antenna.

BRIEF DESCRIPTION OF THE DRAWINGS

The invention and special embodiments are explained in the following using drawing FIGS. 2 to 14.

Figure 1:
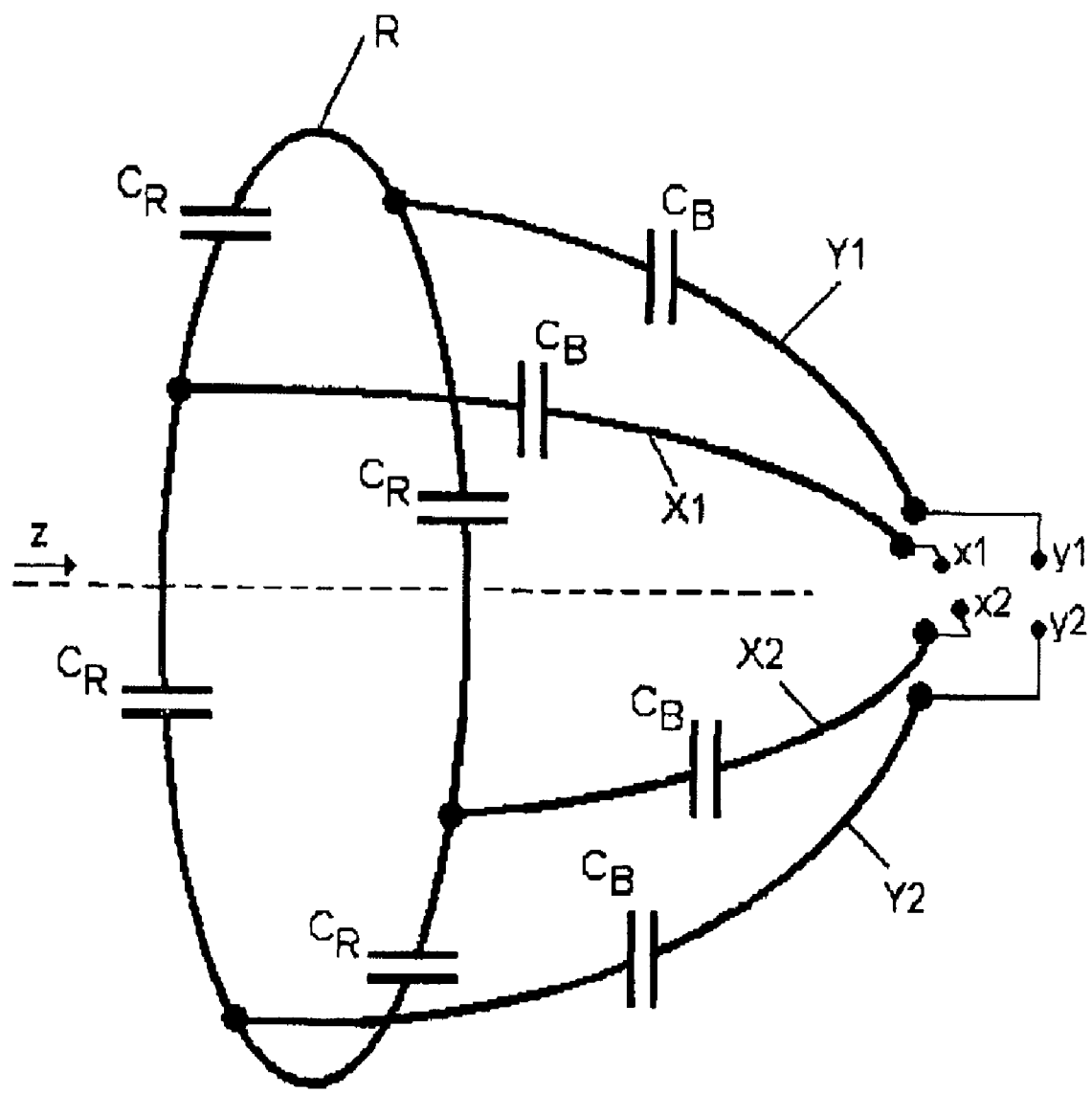
FIG. 1 schematically shows the design of a helmet antenna in accordance with the state of the art.
Figure 2:
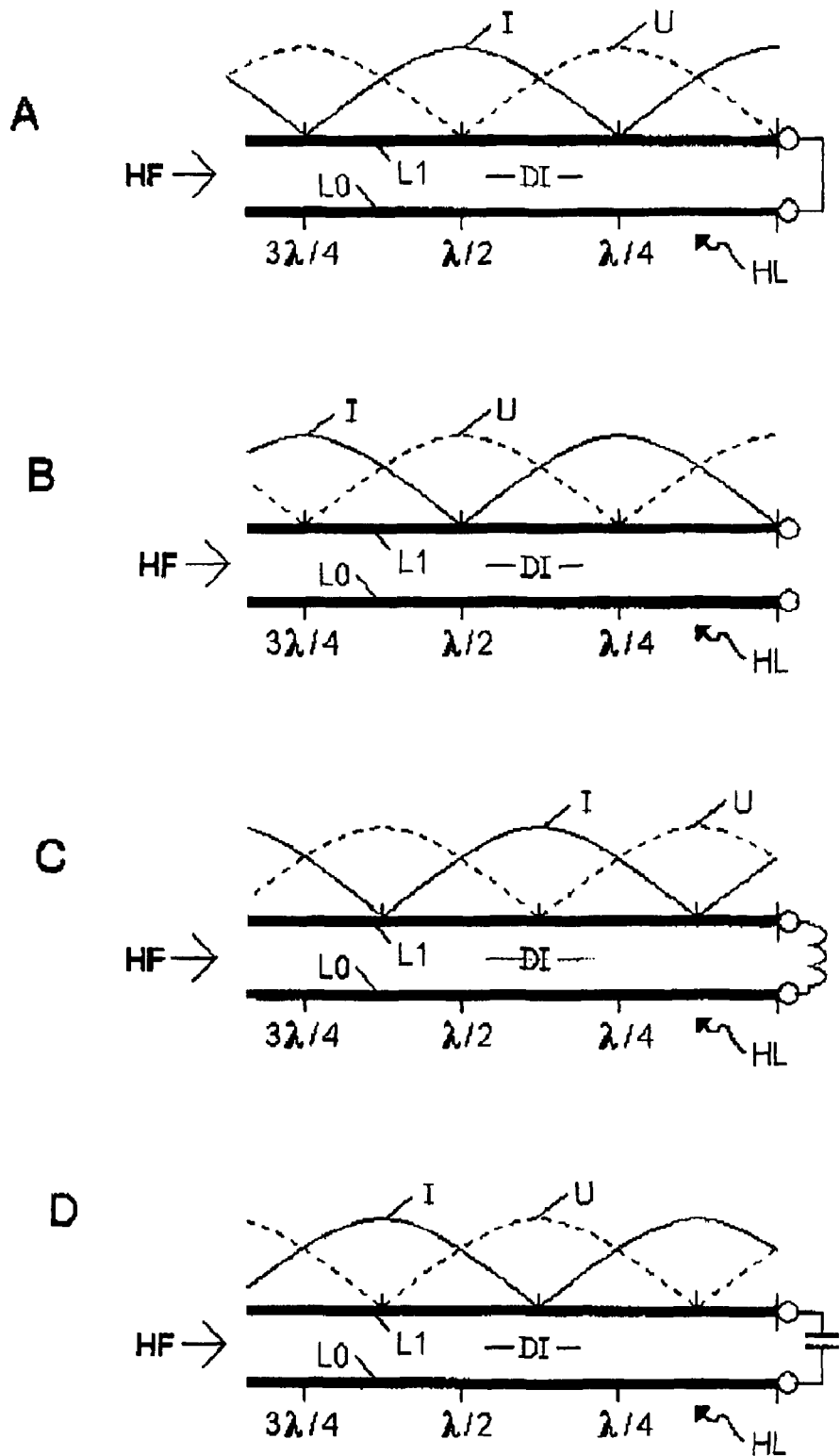
FIG. 2 shows the distribution of current and voltage along an HF line with four different terminations in four images A to D.

In each of the images of FIG. 2 an HF line HL is schematically represented by two parallel lines L0 and L1 with a dielectric Dl located between them that has a relative dielectric constant $\epsilon_r$. It is assumed that line HL is lossless or so low-loss that line losses can be ignored. An HF generator (not shown) is located at the left origin of line HL, which generator feeds line HL with HF power with a frequency f so that a guide wave with the wavelength $$\lambda = c_0/(f*\sqrt{\epsilon_r})$$

is propagated in line HL, wherein $c_0$ is the speed of light in the free space.

The image A in FIG. 2 shows the case in which the line HL is short-circuited on the end. In a line terminated with a short circuit the formation of a maximum occurs in the line current I at the end of the line. The voltage U is zero on the terminator in this case. As a consequence of the reflection on the end a standing wave forms so that the conditions reverse at a distance of $\lambda/4$ from the end, that is, a voltage maximum is produced at this location and the current is zero. The $\lambda/4$ conducting section terminated with a short circuit behaves like a parallel oscillating circuit. After a further path section of $\lambda/4$ in the direction to the generator, that is, at a distance of $\lambda/2$ from the end, the conditions are reversed again. The $\lambda/2$ conducting section behaves like a series oscillating circuit. Conducting sections with the length $\lambda/4$ or $\lambda/2$ are therefore suitable as resonator.

An open end of the HF line HL also reflects the total HF power so that a standing wave also forms here. Image B in FIG. 2 shows the distribution of current I and voltage U along the line open at the end. This distribution is shifted relative to the distribution shown in image A by $\lambda/4$. Series resonance results here at a line length of $\lambda/4$ (and an odd number multiple of it) and parallel resonance at a line length of $\lambda/2$ (and a whole-number multiple of it). Therefore, line sections of this length open at the end are also suitable as resonator.

If the line is terminated with a pure reactance (pure capacitance or pure inductivity) a reflection of the entire power also occurs since, as is known, a pure reactance can only absorb idle power. The series- and parallel resonances are produced here in conducting sections whose length is different of whole-number multiples from $\lambda/4$. For example, the current-voltage distribution schematically shown in image C of FIG. 2 can result in a line terminated with pure inductivity. For example, the current-voltage distribution schematically shown in image D of FIG. 2 can result in a line terminated with pure capacitance. It is noted that all current-voltage distributions between the boundary cases "short circuit" and "open line" can be adjusted by changing the magnitude of the inductivity or capacitance.

It is apparent from the previous explanations that the current- and voltage distribution (relative to the termination point as origin of the coordinates) can be shifted along the HF line by the selection of the termination. This is utilized in a helmet antenna in accordance with the invention in order to minimize an undesired geometrically conditioned HF field gradient inside the measuring volume. This takes place in that the current- and voltage distribution along the HF conducting sections of the antenna is adjusted in such a manner by a suitable selection of the termination that the current distribution and therefore the distribution of the $B_1$ field has a gradient that is in the opposite direction to the undesired gradient.

Figure 3:
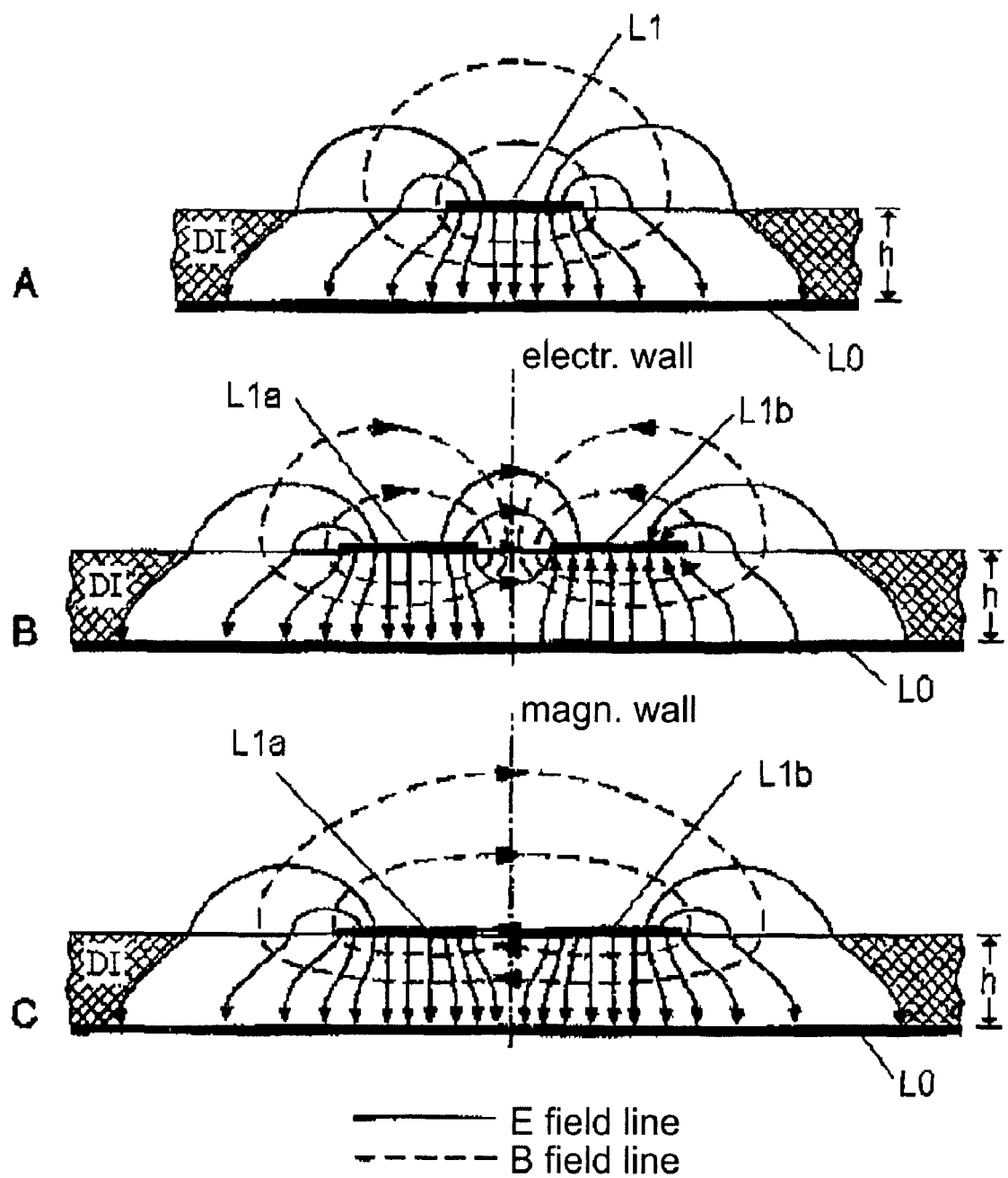
FIG. 3 shows examples of the field distribution of guide waves over the cross section of strip lines with differing construction and at differing modes of operation in three images A to c.

It is advantageous to realize the HF line sections of an antenna arrangement in accordance with the invention with HF strip lines, preferably in the form of strips of thin metallic foils on opposite surfaces of a carrier consisting of dielectric material. It is also known from previous experience with the design of antennas that it is advantageous to use thin foils as inductivities since the elevation of the current density at the edges of the foil results in a homogenization of the $B_1$ field in the measuring volume, see [15]. In addition, thin foils achieve a better suppression of undesired eddy currents in the antenna. This recognition is further developed in the antenna in accordance with the invention in that several line elements are advantageously arranged adjacent to each other at a certain distance for the homogenization of the HF field. FIG. 3 illustrates the changes to be expected with regard to the field distribution.

Image A in FIG. 3 shows the field distribution over the line cross section when using a strip conductor arrangement that comprises a broader conductor strip or a conductive base plate L0 on the one (lower) side of a dielectric D1 and a narrow conductor strip L1 on the opposite (upper) side of the dielectric. It is advantageous to dimension the width of the upper strip not larger than 20 times the thickness of the dielectric and a smaller value is preferably selected. The width ratio of the upper and of the lower conductor has an effect on the penetration depth of magnetic field $B_1$. Given the preference for using dielectrics with a thickness h less than 1 cm, the approximation of the formation of a quasi guide wave is sufficiently justified. Therefore, substantially only electric and magnetic fields exist transversally to the line length, namely, with the field distribution schematically shown in image A of FIG. 3. The electrical field lines are sketched as solid lines and the magnetic field line are sketched as dotted lines.

It the arrangement is expanded to two conductor strips L1a and L1b on the top of dielectric D1 the field distributions shown in images B and C of FIG. 3 can be achieved as a function of the oscillation mode. Image B corresponds to the case in which the current flows on the two conductor strips L1a and L1b in opposite directions. Due to the resulting voltage difference between the two conductors an electrical field (E field) is formed in this instance that vertically penetrates the plane in the middle of the arrangement. In this instance, one speaks of an electrical wall. If current flows cophasally through both conductor strips L1a and L1b the field distribution shown in image C of FIG. 3 is observed. This type of operation is as a rule the preferred variant.

In general, given N conductor strips over a conductive base plate N oscillation modes can be simultaneously set.

It was found that the distribution of the resulting total field observed in the longitudinal direction can be influenced by suitably selecting the terminations of the individual conductor strips opposite the base plate. This can be utilized in a special embodiment of the invention in that the terminations are selected in such a manner that the desired $B_1$ gradient results in order to either compensate a geometrically conditioned $B_1$ gradient in the measuring volume or to place a bulge of the $B_1$ field concentrated in the local range of the measuring volume.

It is noted at this point that the wider conductor can be divided at the base surface in order to suppress eddy currents (conditioned by the switching of $B_0$ gradients for location coding in the MRI or the localized MRS) into narrow strips in the longitudinal direction with individual slots on the order of approximately 1 mm. This is possible since HF currents flow only in the longitudinal direction of the strip line. Since the slots between the individual strips are very narrow in comparison to the wavelength of the HF, no appreciable inverse amplification factor of the HF occurs. The thickness of the wider conductor can be dimensioned to be approximately equal to the skin depth at the magnetic resonance frequency used, e.g., in a range between once or twice the skin depth as a further measure for suppressing eddy currents.

Figure 4:
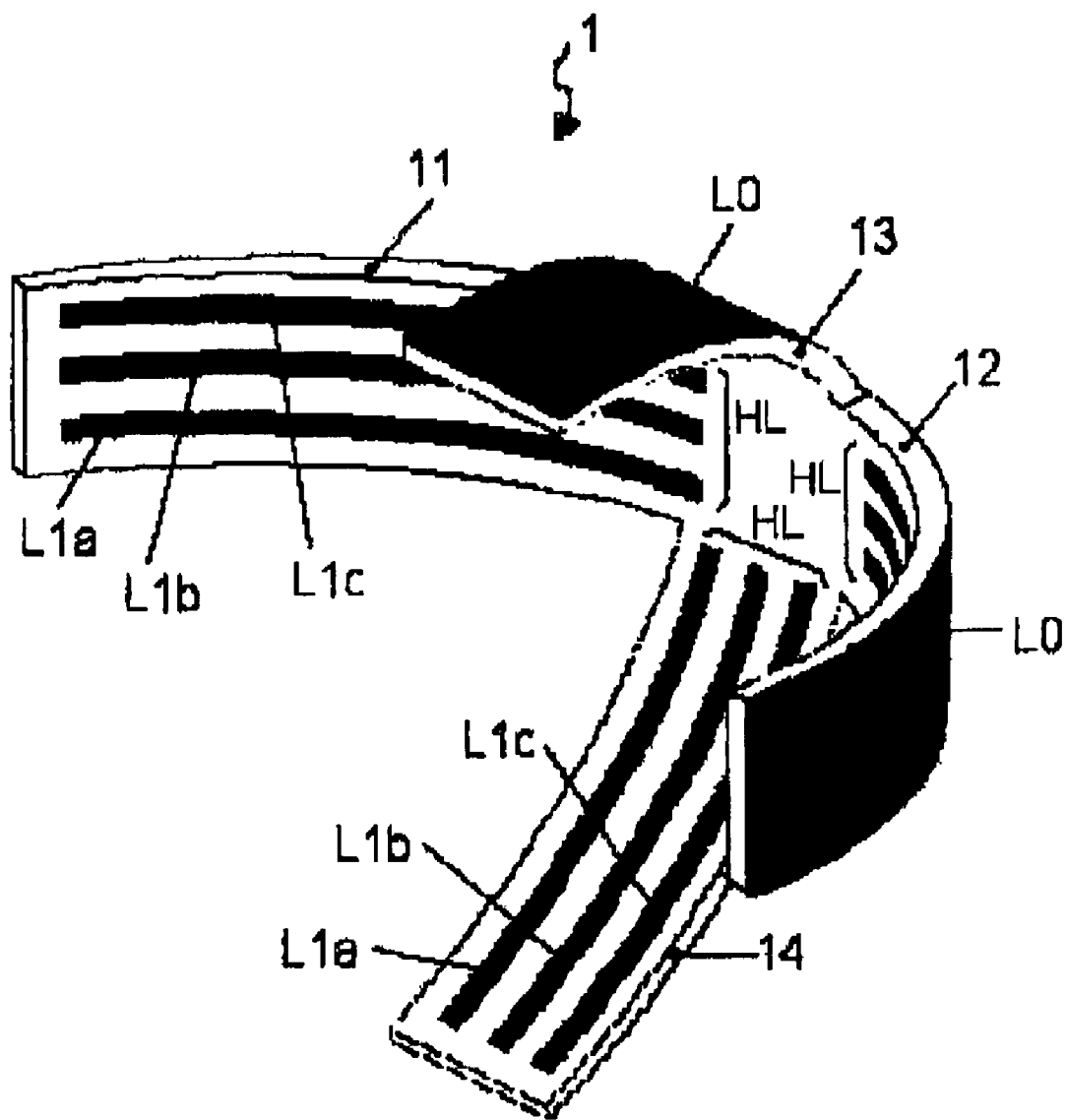
FIG. 4 shows the spatial design of a preferred embodiment of a helmet antenna in accordance with the invention.

FIG. 4 shows the spatial-bodily design of a preferred embodiment of a helmet antenna 1 in accordance with the invention. A carrier body of dielectric material forms four strip-shaped arms 11, 12, 13, 14 that spread out starting from a central vertex area in four directions offset by 90° to each other. The arms assume a curved course in such a manner that they can surround an object to be examined such as, e.g., the upper part of the human head in a claw-like manner. The outside of each of the arms ("claws") 11 to 14 is coated over its entire area with a conductive coating L0 (that can also be designed slotted in order to suppress undesirable eddy currents) and in the case shown three conductor strips L1a, L1b and L1c are present on the inside and run adjacent to each other (parallel in the case shown) and at a distance from each other in the longitudinal direction of the particular arm. Thus, each arm forms three spatially parallel HF conducting sections that can be terminated in order to form line resonators and can be provided with coupling elements for coupling HF power in or out. The terminations and coupling elements are not shown in FIG. 4.

The number of the "inner" conductor strips L1 can also be equal to 1, 2 or greater than 3. The number co-determines the width of the strip lines. On the one hand, sufficient space should remain free between the claws in order to have sufficient room for audiovisual or other accessory apparatuses (video glasses, earphones, etc.); on the other hand, the homogeneity of the field becomes better the greater the number of the inner conductor strips and/or their width. The number of three conductor strips can be a good compromise between these requirements.

The design shown in FIG. 4 can be produced in that at first a plane cross is cut out of a plate of a dielectric material such as, e.g., polypropylene (PP plate). If the helmet antenna should have less or more than four arms, a star with the corresponding number of arms can be cut out instead of a cross. The PP is subsequently bent under the supplying of heat, e.g., across a rotationally symmetric form body. The form body can be, e.g., dome-shaped, cup-shaped or cone-shaped or assume any intermediate form if this is necessary in order to form a certain field gradient or for adaptation to a certain object form. Note that the optimal values of the width of the arms, their thickness as well as their length are a function of the form of the object to be examined. For example, for examinations of the human brain a thickness of the dielectric body of approximately 0.5 cm, an arm width of approximately 7 cm and an arm length of approximately 23 cm are suitable. The material for the dielectric body can also be freely selected within broad limits. It should have, to the extent possible, values comparable or better in magnitude to PP as regards its electrical properties (e.g., the dielectric constant $\epsilon_r$ and the loss factor) and be able to be produced in the desired form.

It is to be noted here that in strip lines the thickness of the dielectric is a parameter that can also be dimensioned in a targeted manner in order to contribute to the realization of a desired field distribution in the volume of interest. According to recently published calculations the penetration depth of the field in the object being examined increases up to a thickness of approximately 6 cm as the thickness of the dielectric grows, see [16].

The dielectric body can of course also be formed in a different manner and/or formed from another high-grade dielectric. During the forming the properties of the dielectric should not noticeably deteriorate in order to be able to realize sufficiently lossless HF lines. This is important so that the wave propagation along the waveguide can be observed approximately in two dimensions, see, e.g., [17].

However, if one wishes to avoid the expense of manufacturing a complicated form for the base body, four (or more or less) separate PP plates with a width of, e.g., 7 cm, a length of, e.g., 20 cm and a width of, e.g., 0.5 cm that are held together on one end by suitable means can be used to form the dielectric carrier.

It is known that antennas controlled symmetrically to the ground result in a lesser interaction with the surroundings and that in the case of antennas operated in quadrature a halving of the required transmission power occurs, and that in the case of reception the SNR increases by a factor of 1.4. For this reason in an advantageous embodiment two opposite arms of the antenna are electrically combined to a group and are controlled symmetrically to the ground. The arms offset by 90° (or 270°) are also combined to a further group and controlled with a voltage that is symmetric as regards the earth potential and is phase-shifted by 90°. Note that this concerns only an advantageous design variant.

An antenna in accordance with the invention can also be constructed and operated with only two opposing arms. It is also possible to tune different arms of the antenna to different frequencies and thus create an antenna that can be used to examine several nuclei (e.g., when using a proton-decoupled $^{13}$C spectroscopy or other decoupling experiments or in correlation or separation experiments with two or more nucleus types).

It is finally noted that an antenna in accordance with the invention can also basically be used as a parallel transmitting antenna, as a parallel transmitting/receiving antenna or as a parallel receiving antenna if each antenna or each group of antenna elements is provided with its own transmitting and receiving channels. Furthermore, an antenna in accordance with the invention can of course also be adapted in its size for other measurements in that, e.g., materials with other dielectric properties are used or in that additional discrete components are inserted in order to vary the electrical length of the HF lines.

Two variants are described in the following by way of example using FIGS. 5 to 7 for the coupling of the resonators formed from the strip lines to the HF transmitter (for transmitting operation) or to the receiver (for receiving operation) or to a transmitter/receiver. A mixed capacitive/inductive coupling is also conceivable such as is used, e.g., in band-pass filters. The HF strip line HL is shown in longitudinal section in these figures and consists in the instance shown of two conductor strips L0 and L1 with a dielectric D1 located between them similarly as in the presentations of FIG. 2. Conductor strip L0 is the conductor connected to mass or ground and corresponds e.g., to the "wide" or slotted metal coating L0 on the outer surface of one of arms 11 to 14 shown in FIG. 4.

As was already explained for FIG. 2, standing waves are observed in the case of strip lines not terminated with the wave resistance. Current and voltage are shifted here by 90° in the phase. If the line HL is not precisely tuned as regards its length to the corresponding resonance frequency a suitable reactance such as, e.g., a transversely connected "tuning" capacitor $C_{T1}$ can be used for fine tuning as is sketched in dotted lines in FIGS. 5 to 7. This capacitor "shortens" the geometrical length required for the line in order to achieve the desired electrical length. Such a shortening is suitable for better adapting the geometric dimension of the HF lines used as antenna elements to the dimension of the volume area of interest of the object to be examined. If desired, a lengthening of the line by means of appropriately suitable reactive elements and a suitable selection of their insertion type is possible as well. Of course, it is also possible to adjust the ratio between electrical and geometric length by a special dimensioning of the $\epsilon_r$ value of the dielectric.

It is advantageous in every case to create the possibility of a certain fine tuning in order to also be able to compensate loading effects in addition to manufacturing tolerances. In an antenna formed by HF lines the fields of the guide waves interact with the object to be examined that forms the "load" of the antenna. This load is not entirely without influence on the wavelength and therewith on the electrical length of the HF line. It is therefore recommended when dimensioning the geometric length of the HF line to pay attention that there is a certain play in order to be able to adjust the electrical length by tune reactances precisely to the dimension after loading the antenna. Therefore, if a certain electrical length is mentioned here as operating parameter, this means the electrical length that results when loading the antenna.

A capacitive coupling takes place most effectively in the vicinity of the voltage maximum (in a λ/4 line short-circuited on the end this is the end opposite the short circuit). The principle of capacitive coupling is schematically shown in FIG. 5. The coupling to the transmitter/receiver S/E takes place via a coupling condenser $C_K$ that also advantageously ensures the required adaptation of the wave resistance of the feed line (coaxial in the case shown) FL to the resistance of the resonance circuit formed with the strip line HL and can be adjusted for this purpose.

If it is desired to couple the transmitter or receiver S/E inductively to the strip line resonator, the area in the vicinity of the current maximum is advantageously selected for this and a coupling loop or coupling coil is positioned there. For a strip line short-circuited on the end this is the area in the vicinity of the short circuit. FIG. 6 schematically shows the scheme of the inductive coupling to the oscillating circuit. The inductive coupling is brought about in the simplest manner in that a bore is provided at a short distance from the short circuit from the side carrying conductor L0 through dielectric Dl to conductor strip L1. A connection wire is run inside this bore from conductor strip L1 to the inner conductor of coaxial feed line FL. This connection wire forms together with the short-circuited end of strip line HL a coupling loop that is connected in parallel to the residual part of the strip line. FIG. 7 shows the equivalent circuit for the coupling loop as inductivity $L_K$. A resistance transformation can be achieved via the size of the coupling loop. The coupling loop can be tuned via a further, parallel-connected tuning condenser $C_{T2}$ to the desired resonance frequency. An adjustable capacitance $C_M$ can serve as "matching" condenser for the adaptation to the coaxial cable to the transmitter/receiver.

Figure 8:
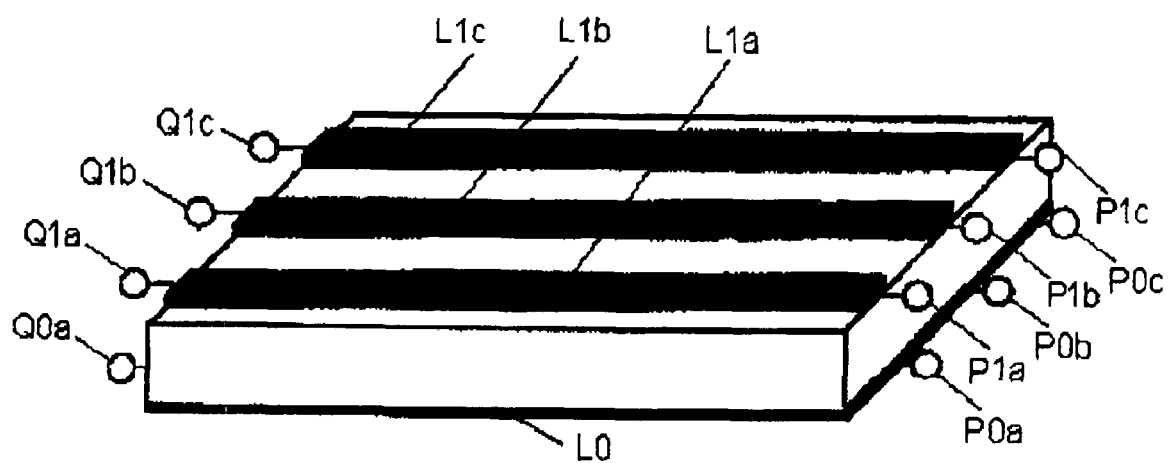
FIG. 8 shows closer details of the strip line arranged on the arms of the helmet antenna according to FIG. 4.

Examples are given in the following for the bodily and the electrical dimensioning and for the connection manner of the antenna arrangement shown in FIG. 4 in order to be able to use this arrangement as a quadrature helmet antenna for examining the human brain. At first the bodily dimensioning:

In an arrangement produced as prototype, the outside of the four arms 11, 12, 13, 14 according to FIG. 4 were coated over their entire width with a thin conductive layer L0 of self-adherent Cu foil. It is pointed out at this point that a foil thickness on the order of the skin depth at the HF (e.g., 5 to 25 μm) is advantageous on account of a damping of undesired eddy currents. Subsequently, conductive layers were also applied onto the inside on the positions provided for this with self-adherent Cu foil. The three conductor strips L1a, L1b, L1c strips of self-adherent Cu foil are adhered symmetrically to the longitudinal middle line of the arms in this prototype. In order to illustrate more closely the bodily features and the spatial dimensions, FIG. 8 shows one of the four antenna arms 11 to 14 via the section containing the conductor strips L1a, L1b, L1c. In order to simplify the illustration, this section that is usually bent in actuality is shown in a straight developed view.

On one end connector strips L1a, L1b, L1c are provided with termination connections P1a respectively P1b respectively P1c that form a connection pair in each case with correspondingly arranged termination connections P0a, P0b, P0c of the "base conductor" L0. A similar arrangement of connections Q1a, Q1b, Q1c on connector strips L1a, L1b, L1c and of connections Q0a, Q0b, Q0c on base conductor L0 is present on the other end. The cited connections are represented only symbolically in order to symbolize the presence of any possibility of electrical connection.

The strip width was calculated as a function of the selected thickness of the dielectric (0.5 cm), the desired wave resistance (approximately 80 Ω) and the desired field profile. Guidelines for the design are to be found in the literature, see, e.g., [18], [19], [20]. In the example presented here the strip width is 0.7 cm. The interval between the conductor strips L1a, L1b, L1c is 1.5 cm. For the intended application a width b of each arm of approximately 7 cm represents a good compromise regarding homogeneity of the $B_1$ field and as regards the desired structural freedom for additional audio-visual supplementary apparatuses. A dimension of approximately 18 μm proved to be advantageous for the thickness of the inner as well as of the outer conductor strips. The length of the conductor strips was determined at 23 cm considering the aimed-at detection of the entire brain.

It is noted here that the antenna arrangement in accordance with the invention can also be realized with strip lines dimensioned in such a manner that they deviate from it as well as with a different number of strip lines. It is furthermore noted that the dielectric for the strip lines can also be air (or a vacuum). In this case the conductive layers would have to be designed to be self-carrying or be stabilized on the opposite side with a dielectric. In addition to PP even other dielectrics such as, e.g., Teflon (or Teflon with various embeddings of ceramic powder) and other low-loss substrates can of course also be considered. Instead of the self-adherent Cu foil other processes can of course also be used to apply metallizations.

The distribution of current and voltage along the strip lines can be adjusted in such a manner by a purposefully directed selection of the electrical connection manner and the terminating of the strip lines that a desired $B_1$ field distribution results over the area of the object to be examined surrounded by the helmet antenna. Several different variants for the connection manner and termination of the antenna arrangement shown in FIGS. 4 and 8 are described in the following in order to show how the various current and voltage distributions can be achieved.

In a first variant the three strip lines of each arm that consist of one of the conductor strips L1a, L1b, L1c and of the "base conductor" L0 are short-circuited on one end, that is, there is a short-circuit connection, e.g., on the connection pairs P0a-P1a, P0b-P1b, P0c-P1c. In order to simplify the tuning all ends of the three conductor strips L1a, L1b, L1c belonging to a group are directly connected to each other, that is, there is a short-circuit connection between the connections Q1a, Q1b, Q1c.

Figure 5:
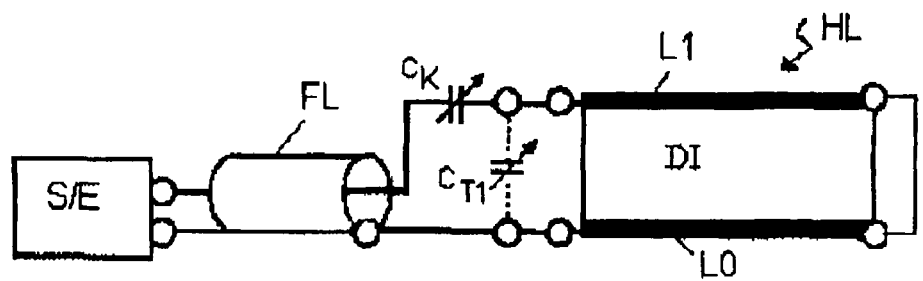
FIG. 5 schematically shows a capacitive coupling of the feed line on an HF strip line.

The coupling to the HF transmitter or HF receiver S/E preferably takes place in this variant capacitively in accordance with the representation in FIG. 5. It is noted here that the connection to tuning condenser $C_{T1}$ can also take place via a short semi-rigid cable (approximately 6 cm long in the example explained here). The cable can also be made with another length. It should, however,␣be shorter than λ/4.

The strip lines of two diametrically opposed arms (e.g., the arms 11 and 12 in accordance with FIG. 4) are connected with a 180° phase jump to the same tuning condenser $C_{T1}$ and connected via the same tunable coupling condenser $C_K$ to coaxial feed cable FL. The tuning and adaptation take place in accordance with the principle illustrated in FIG. 5. The 180° phase jump is preferably selected so that the magnetic field generated by both shanks has the same direction and sums in the overlapping range. In the opposite case a field distribution analogous to a Maxwell distribution is obtained. In this case the signal in the center would be suppressed. The electrical connection of the strip lines of the two other arms (that is, the arms 13 and 14) takes place in the same manner using a common tuning condenser and a common coupling condenser with a second coaxial feed cable (not shown).

The two feed cables are coupled via a hybrid coupler to the transmitter or the receiver, respectively, so that a phase difference of 90° of the HF power components results that are transmitted during the sending operation into the two channels. During the receiving operation the signals from the two channels are added in the receiver. It is of course also possible to arrange the hybrid coupler and a suitable preamplifier directly on the antenna construction or, in the case of a pure receiving antenna, to provide each strip line directly with a preamplifier. Following the preamplifiers the signals of the individual antennas are constructively added.

Figure 6:
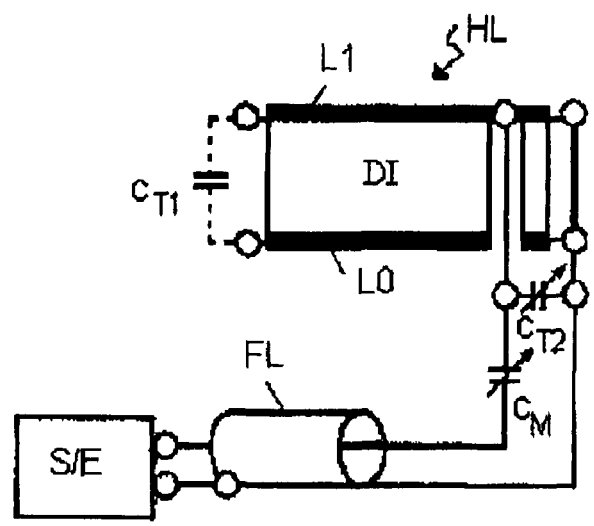
FIG. 6 schematically shows an inductive coupling of the feed line on an HF strip line.
Figure 7:
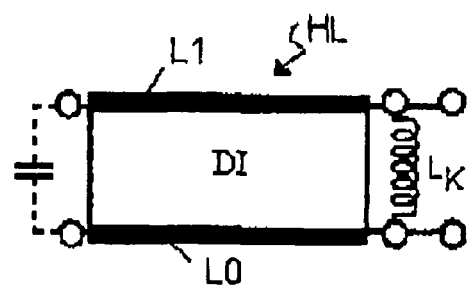
FIG. 7 shows the equivalent circuit of the inductive coupling according to FIG. 6.

In a second variant the coupling to the transmitter and the receiver S/E takes place inductively, as is illustrated in FIG. 6, the strip lines being terminated with short circuits on one end. On the other end the strip lines are closed with tuning condenser $C_{T1}$. For example, the Larmor frequency for protons at a main field strength $B_0$ of approximately 3 T (approximately 125 MHz) is selected as tuning frequency. It is noted here that the conductor circuits can of course also be tuned to the Larmor frequency for protons at higher $B_0$ field strengths or also to the Larmor frequency for other species with a nucleus spin different from zero. It should be furthermore noted that in order to fulfill the resonance condition even correspondingly dimensioned discrete reactants can be additionally attached at different positions on the strip lines.

The inductive coupling of the resonators formed with the strip lines to the control network (feed lines FL and transmitter/receiver S/E) purposefully takes place in the vicinity of the current node since the inductive coupling is especially effective here (see FIG. 6). How strong the resonator is damped by the control network and how the resonance resistance is transformed is adjusted by the selection of the length of the coupling section between short-circuit and coupling point. The condenser $C_{T2}$ for the fine tuning can be connected parallel to the coupling loop. Furthermore, the adjustable series capacitance $C_M$ with a suitable magnitude can be inserted as matching condenser.

The distribution of current and voltage along the strip lines can be mirrored with the first two variants, namely, by replacing the locations of coupling and termination.

In a third variant the strip lines are capacitively terminated and the coupling to the control network takes place capacitively in accordance with FIG. 5. That is, a termination condenser (not shown) is provided, e.g., on the connection pairs P1a-P0a, P1b-P0b, P1c-P0c shown in FIG. 8. On the other end the three conductor strips L1$a$, L1$b$, L1$c$ are directly connected to each other. It can be achieved with this arrangement that the current maximum of the strip lines shifts toward the middle range of the strip lines. The profile of the distribution of current and voltage along the strip lines can be shifted by varying the termination capacitance and tuning capacitance $C_{T1}$.

In a fourth variant the strip lines are inductively terminated on one end, a coil being used in each instance as terminator. That is, a termination coil (not shown) is provided on each of the connection pairs P1$a$-P0$a$, P1$b$-P0$b$, P1$c$-P0$c$ shown in FIG. 8. On the other end the three conductor strips L1$a$, L1$b$, L1$c$ are directly connected to each other and connected via a coupling condenser to the inner conductor of a coaxial feed line. It can also be achieved with this arrangement by varying the termination inductivity and the tuning capacitance that the distribution of current and voltage is shifted along the strip line. In this case the voltage maximum can be shifted toward the middle range of the strip conductors.

In all previously described variants the particular termination mentioned can be provided on the "neck side" end of the strip lines (that is, on the end directed to the neck of the person to be examined when the helmet antenna surrounds the head) or on the opposite "vertex side" end. It is also possible to terminate each end of at least one of the strip lines open, short-circuited or reactive in the same manner and to provide a switching device in order to exchange the second end selectively in its electrical function with the first end.

Figure 9:
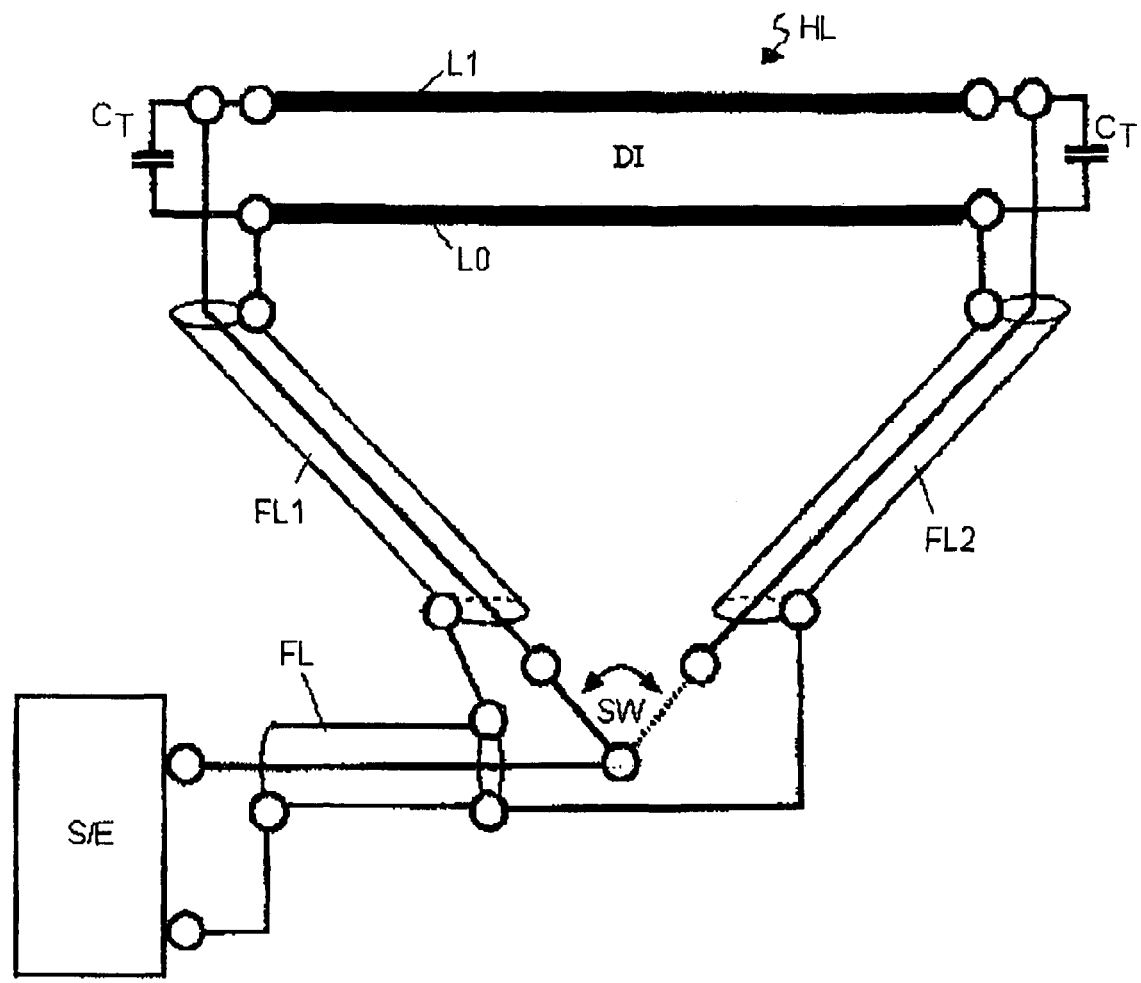
FIG. 9 schematically shows an apparatus for exchanging the termination of a strip line.

FIG. 9 shows an arrangement that permits a changing over of the strip lines between two connection types with short-circuit termination as an example for such an exchange possibility. Each of the two ends of the strip line has a transversely connected "tuning" capacitor $C_T$ and is connected to a separate coaxial branch feed line FL1 and FL2, namely, by connecting base conductor L0 of the strip line to the outer conductor and by connecting all conductor strips L1$a$, L1$b$, L1$c$ to the inner conductor of the particular branch feed line. Both branch feed lines FL1 and FL2 have an electrical length equal to an odd multiple m>=1 of a quarter wavelength $\lambda/4$ and branch off via a change-over switch SW from a coaxial main feed line FL0 connected to the transmitter/receiver S/E. In order to produce the short circuit as termination on a desired end of strip line HL, the change-over switch SW is adjusted in such a manner that the particular branch feed line is open at the location of the change-over switch SW, which is transformed via the m*$\lambda/4$ length into a short circuit on the associated end of the strip line. Thus, a current antinode and a voltage node are produced at this location. On the opposite side, the strip line is tuned to the desired resonance frequency with tuning condenser $C_T$.

The role of the two ends of the strip line can be exchanged by switching over the change-over switch SW. As a result thereof the distribution of current and voltage along the strip line HL is mirrored. It is therewith possible to change the gradient of the $B_1$ field during the experiments. This example is intended to clarify that not only the gradient of the $B_1$ field can be adapted to the wishes in the experiment with an antenna in accordance with the invention but also that it is possible to change this profile over in an experiment, e.g., by using rapid switching diodes as change-over switch SW. Instead of the arrangement shown, that contains one simple change-over switch SW on the inner conductor of the feed line branch, even more complex arrangements with PIN diodes are of course possible.

Further variants of the connection method and operation method of the helmet antenna in accordance with the invention consist in tuning different arms of the claw-shaped antenna arrangement to different Larmor frequencies. Thus, e.g., the strip lines of two diametrically opposed arms can be tuned to the Larmor frequency of first type of nucleus whereas the strip lines of the other arm pair, offset by 90°, can be tuned to the Larmor frequency of another type of nucleus. Both partial antennas each formed on a pair of opposite arms are decoupled from one another and can be used to examine different species during an experiment. However, it is also possible to use networks [23] for tuning the line circuits that consist, e.g., of a parallel oscillating circuit (tank) and a condenser connected in series. The series-connected condenser determines the low resonance frequency of the strip line whereas the upper resonance frequency of the strip line is determined via the resonance frequency of the tank circuit. Such a network can also be provided with several tank circuits for tuning. This can bring it about that each strip line is in resonance at several Larmor frequencies. Antennas in accordance with the invention can also be realized in accordance with this principle that are operated in quadrature and can be used simultaneously for several Larmor frequencies. If the Larmor frequencies are located closely to each other, variants are of course possible in which, e.g., the supercritical coupling between resonance circuits is used to adjust the different Larmor frequencies [23].

Figure 10:
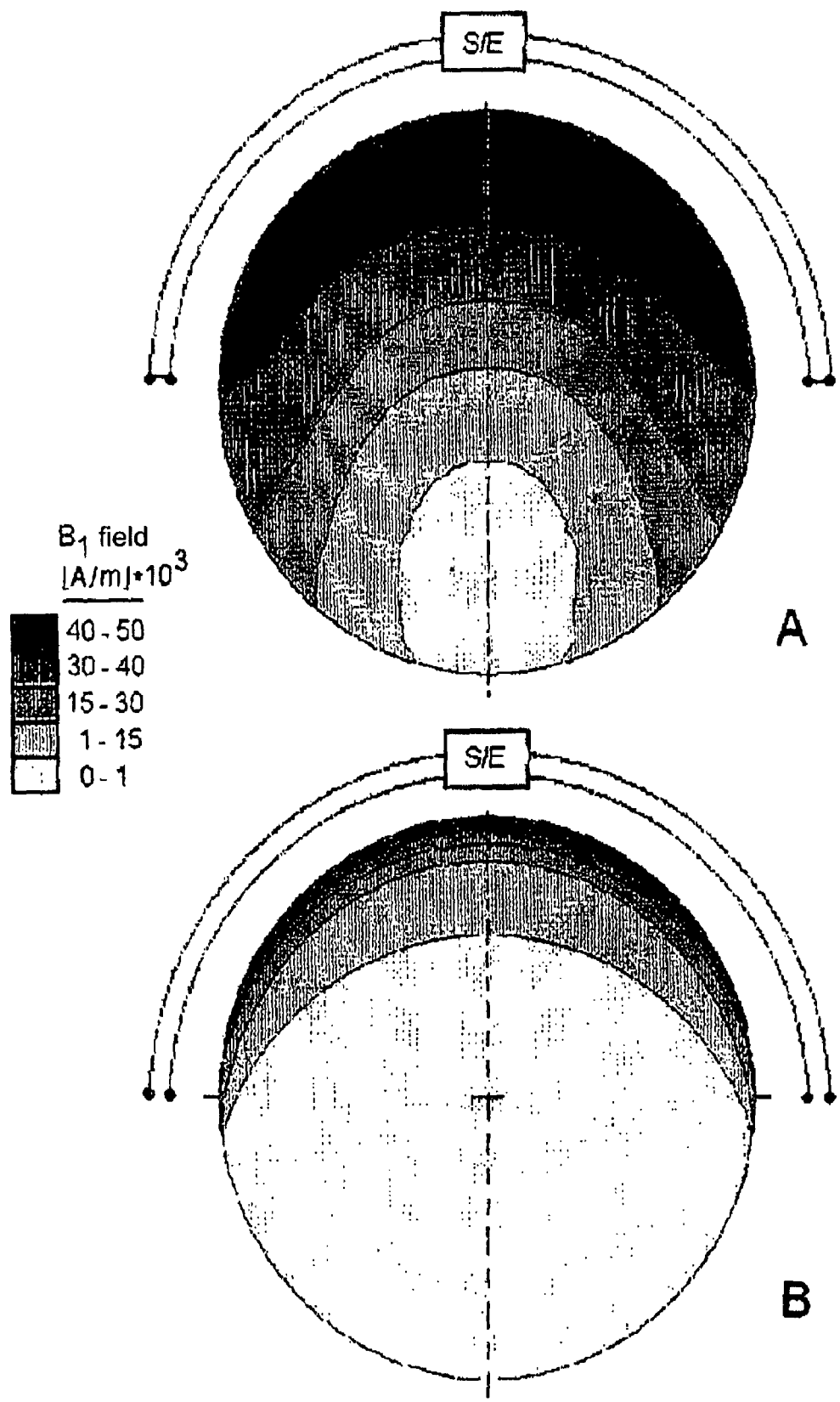
FIG. 10 shows, in a roughly schematic view, the distribution of intensity of the $B_1$ field in a phantom object using a helmet antenna in accordance with the invention with two different terminations of the strip lines.

In order to demonstrate the advantageous properties of a helmet antenna in accordance with the invention, a dome-shaped (approximately hemispherical) form of the antenna arrangement with four arms offset by 90° and consisting of HF strip lines similar to the embodiment according to FIG. 4 was taken as base with an electrical length in each instance of $\lambda/4$, and the distribution of intensity of the $B_1$ field within a spherical phantom object that simulates a human head was estimated by numeric calculation. FIG. 10 shows in a roughly schematized form in two images A and B the results for two different terminations: once for short-circuit termination (image A) and once for "open" termination (image B). FIG. 10 illustrates different intensity ranges of $B_1$ field strengths with different shades of gray in which the "measure" for this type of representation is constituted by the gray-step scale at the left in the figure.

Image A in FIG. 10 shows that given a short-circuited termination the $B_1$ field is distinctly concentrated on the vertex-side half of the object, that is, on the volume area of the head that is of interest when the entire cerebrum is to be examined. Furthermore, the gradient of the $B_1$ field is low in this area and a relative homogeneity of the $B_1$ field therefore results as is shown by the low number of different gray step within the area. A significantly weaker field results toward the neck-side end, as is desirable.

Image B in FIG. 10 discloses, however, that with open termination, a strong $B_1$ field only exists close to the outer edges in the vertex-side half of the objects and that the field strength decreases very rapidly towards the center. This termination is thus not useful for the illumination of the entire cerebrum, it can, however, be purposeful if the marginal areas such as the cerebral cortex of the space between brain and cranial bone or the upper cranial bones themselves can be examined in a targeted manner.

The field distribution shown in image A in FIG. 10 can be further optimized by special modifications of the termination and/or of the geometric course of the HF lines, depending on the application. For brain measurements the $B_1$ field gradient can be reduced even further in that the HF lines are terminated on the neck-side ends with inductivities. However, the magnetic field is then reduced in the middle and upper area of the brain. It is also possible to make the form of the helmet antenna "flatter" in the upper area, e.g., by elliptical curvature of the HF lines (ellipsoidal form of the upper area) or even approximately rectangular curvature of the HF lines (cup form or cylindrical form of the helmet antenna).

Figure 11:
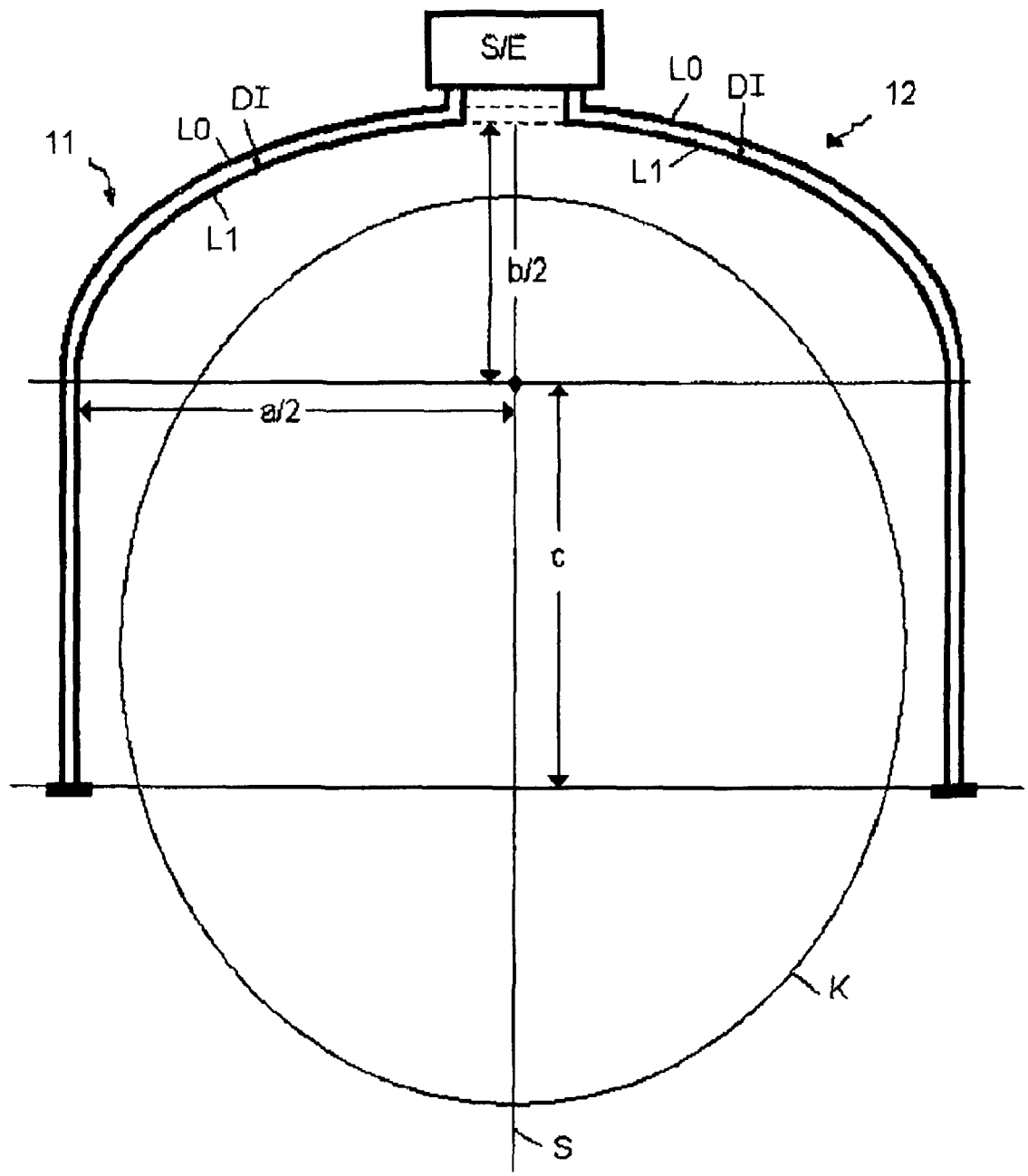
FIG. 11 shows a preferred geometry of a helmet antenna in accordance with the invention.

An exemplary dimensioning of the helmet antenna in accordance with the invention for examinations of the human brain, that is, the volume of interest is the calotte of the head comprising the brain volume, is described in the following using FIG. 11. FIG. 11 shows this helmet antenna schematically in a view of a longitudinal section passing through the center axis or axis of symmetry S running in the z direction and through two diametrically opposite strip line arms 11, 12 of the helmet antenna. The outer conductor strip L0 runs on the outside of the dielectric material D1 of each arm and the inner conductor strips L1 run on the inside. The object to be examined, that is, a human head, is schematically indicated by contour line K. The vertex-side ends of the HF line arms form the feeding point and are coupled to the transmitting/receiving apparatus S/E in the manner of FIG. 5.

In the dimensioning example shown in FIG. 11 it is assumed that the relative dielectric constant $\epsilon_R$ of the dielectric D1 is equal to 2.2 and that the magnetic resonance frequency is 125 MHz. At these parameter values each HF line arm would normally have to be approximately 44 cm long in order to obtain the desired electrical length of $\lambda/4$. Since the $B_1$ field should be produced to the extent possible only in the brain area and other areas (in particular on the neck) should be field-free to the extent possible, each arm, taking into consideration the average head size, is only approximately 26 m long, which shortening is electrically compensated by inserting a suitably dimensioned reactance (e.g., by suitably dimensioning the tuning capacitance $C_T$ in FIG. 5). Since the $B_1$ field is very inhomogeneous in the direct vicinity of the HF lines and the presence of tissue close to the HF lines would result in a sharp drop of the quality factor, the minimal distance between head and HF line should be approximately 2 cm. A horizontal inside diameter "a" of at least approximately 23 cm at its widest point and for the total height a value of at least approximately 17.5 cm result from these considerations and from the average head size for the helmet antenna at its widest position.

It turned out that the optimal form of the helmet antenna for the cited purpose is a form which is similar to a bell in which the HF lines in the lower area run up to a height "c" of approximately 11.5 cm parallel (or approximately parallel) to axis of symmetry S and then converge in an elliptical curve according to an ellipse whose one semi-axis length a/2 measures approximately 12 cm orthogonally to axis of symmetry S and whose other semi-axis length b/2 is approximately equal to 7 cm.

Since the magnetic alternating field of the guide wave is aligned substantially transversally to the HF line and decreases with increasing distance, the site of maximal line current is placed in the lower, straight-line area of the HF lines where the diameter of the helmet antenna is the greatest. For this purpose the HF lines are terminated on the ends far from the top, preferably with a short circuit. This brings it about that the field in this area is maximal and also still has great strength close to the axis of symmetry. Even the $B_1$ component (that is, the component orthogonal to the z direction) is maximal in this area because the field there is generated orthogonal to the S axis. In the upper area of the helmet antenna the line current and therewith the magnetic field and consequently also the $B_1$ component of each HF line become weaker toward the vertex. On the other hand, however, the curvature also results in a superpositioning of the field from different parts of the HF line. This counteracts the cited weakening of the $B_1$ component in a compensating manner; however, an undercompensation, compensation or overcompensation can result as a function of the curvature course. A fairly accurate compensation can be achieved by a suitable selection of the curvature course so that the $B_1$ gradient becomes minimal. It turned out that the described elliptical curvature achieves a very good result.

In a $\lambda/4$ line terminated with a short circuit the normalized line current normally drops from the short circuit to the feeding point according to a cosine function of 1 to 0. However, on account of the cited "line-shortening" reactance on the feeding point a drop of 1 to approximately 0.7 (cos 45°) results for the example described here. This results in the construction described here in a certain overcompensation of the cited $B_1$ drop in the curved area of the HF lines. This can be counteracted by additional modification of the curvature course or in that the desired line shortening from 44 to 26 cm is achieved by using a dielectric with a higher $\epsilon_R$ value. Thus, an $\epsilon_R$ value of 10 (e.g., Teflon with embedding of ceramic powder) results in a $\lambda/4$ line length of 23 cm with the strip line used (coating with Cu on both sides) for a frequency of 125 MHz. In this case the shortening reactance at the feeding point is eliminated so that the normalized current drops from the short-circuited end to the feeding point from 1 to 0. Numeric estimations have shown that a certain undercompensation as concerns the $B_1$ drop occurs. A precise compensation can accordingly be achieved if a value of approximately 6 is selected for $\epsilon_R$ and the "remainder" of the shortening is achieved by an appropriately dimensioned reactance at the feeding point.

The helmet antenna in accordance with the invention also has the advantage that it can be readily combined with other antennas, e.g., with a label antenna for carrying out CASL experiments. There is the danger in a combination of several HF antennas that they couple with each other if the magnetic field of an antenna penetrates the other one and vice versa. This results in the known disadvantages of the mutual influencing of magnetic fields, in the reciprocal influencing of the resonance frequency and, from medical viewpoints, in a negative influencing of the SAR values.

Perfusion measurements of the brain with a CASL experiment usually run as follows if a separate label coil is used: In the period of magnetic marking HF power is radiated via the label antenna into the neck of the patient or of the test person or of the test animal, see [7], [21]. At the same time a static magnetic field gradient (label gradient) is switched that can be generated either by the gradient unit of the MR tomograph or by a suitable local $B_0$ gradient coil (see [22]). A stationary state is generated in the brain tissue at which the magnetization is reduced as a function of the blood flow and that is measured via the helmet antenna and read out for imaging. A further experiment is carried out as a control in which the magnetic marking of the blood does not occur. The difference of the images with and without magnetic marking is a quantitative measure for the regional blood flow.

In order to achieve the greatest flexibility in CASL examinations a special embodiment of the invention consists in that a helmet antenna in accordance with the invention and operating with guide waves is combined with a label antenna that also operates with guide waves. The label antenna can consist of one or several HF lines, wherein the above-described principles can also be used here in order to achieve purposeful field distributions for the optimal selective illumination of the volume area of interest and/or to impart a desired course over the volume area of interest to the $B_1$ gradient of the magnetic alternating field.

Strip lines are preferably used for the label antenna. A combination of such a label antenna with a helmet antenna in accordance with the invention is shown in FIG. 12.

Figure 12:
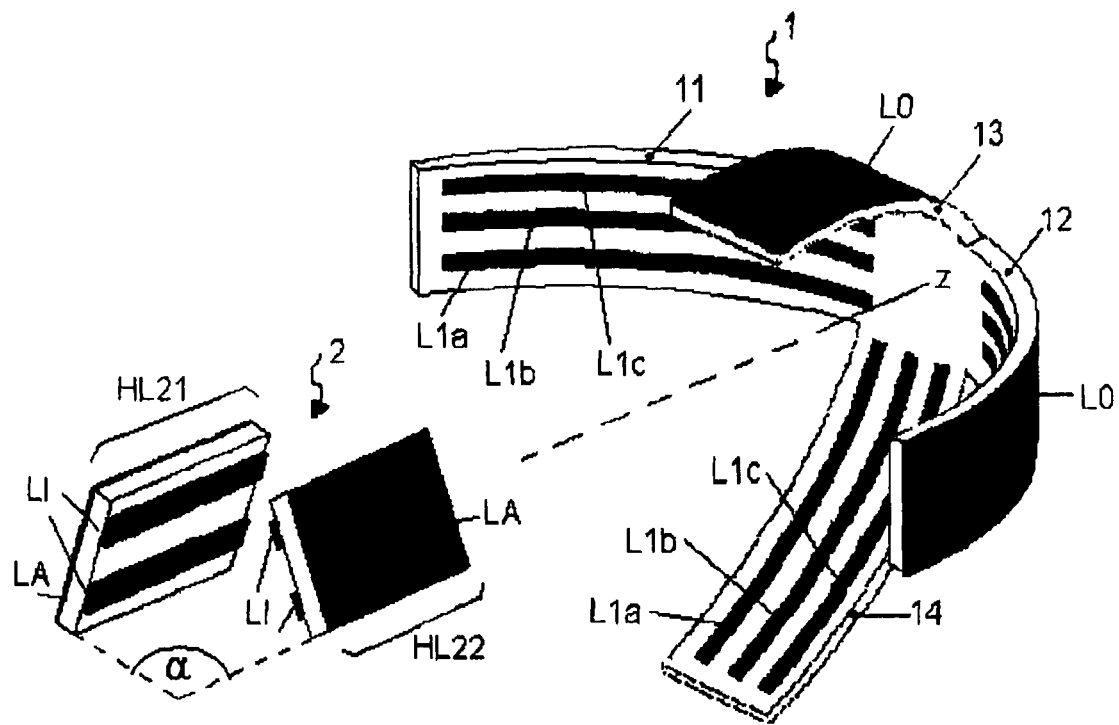
FIG. 12 shows the arrangement of a label antenna in combination with a helmet antenna in accordance with the invention.

The helmet antenna 1 shown in FIG. 12 corresponds to the design shown in FIG. 4, that is, it has four bent arms 11, 12, 13, 14, each with a metallization as base conductor L0 on the outside and three conductor strips L1a, L1b, L1c on the inside. The bodily and spatial dimensioning and the connection type and termination type of helmet antenna 1 can correspond to any of the above-described embodiments. In addition to helmet antenna 1, that would be arranged on the head of a patient, a label antenna 2 is provided that is to be arranged in the neck area of the patient and consists of two HF strip lines HL21, HL22, whose surface normals can enclose an angle a of approximately 60° to 180° and that extend in longitudinal direction z. The two strip lines HL21, HL22 run along two carrier plates 21, 22 consisting of a material with a relatively high dielectric constant (e.g., Teflon with an admixture of ceramic powder) in order to reduce the wavelength along the strip lines. A value (e.g., approximately 5 cm) is selected as length for the strip lines HL21, HL22 at which the individual structures can be comfortably attached over the arteries.

In order to hold the strip lines of label antenna 2 at their destination position a holding device such as, e.g., a flexible band can be provided that can be wound around the neck of the test subject and on which the strip lines are arranged in a stationary or a movable manner. However, the strip lines of label antenna 2 can also be arranged in a stationary or an adjustable manner on the frame of the MR apparatus that also holds helmet antenna 1.

One or more conductor strips can be applied vertically to the direction of blood flow in the area of the carotid arteries on the inside of the particular plate in accordance with the strength of the magnetic field required. The outside of each plate is provided with a metallization that forms an "outer" conductor strip LA that is wider than the arrangement of the "inner" conductor strip LI, that run adjacent to one another, parallel to one another in the case shown. The comments presented further above concerning the helmet antenna logically apply to the control and termination of the inner conductor strips. An embodiment with two inner conductor strips is shown by way of example in FIG. 12, FIG. 13 and FIG. 14.

Figure 13:
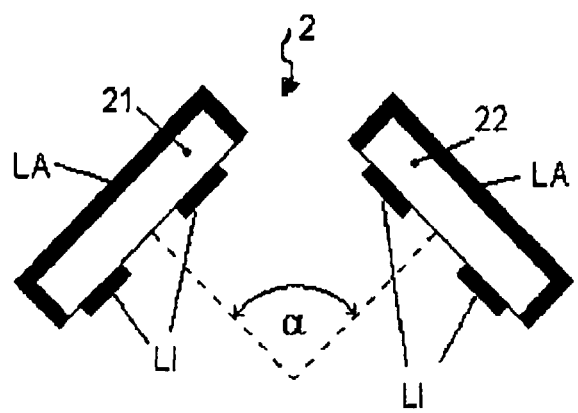
FIG. 13 shows a variant of the strip lines of the label antenna.

The thickness of dielectric plates 21, 22 can be freely selected within a relatively wide range (e.g., 1 to 5 mm). A value of approximately 0.2 to 0.5 cm is to be recommended as the width of inner conductor strip LI. The strip width and the material thickness are advantageously selected in such a manner that the resulting wave resistance corresponds approximately to the wave resistance of the feed cable (not shown in FIG. 12). Plates 21, 22 are adhered on the outside over their entire surface with a 35 μm thick self-adherent copper foil (or metallized with another process) in order to form outer conductor strip L1. The inner conductor strips LI can also be formed by self-adherent Cu foil with the same thickness. In order to increase the focusing of the $B_1$ field the outer metallization LA can be additionally be expanded onto the longitudinal side edge areas of the particular wall, as FIG. 13 schematically represents.

Figure 14:
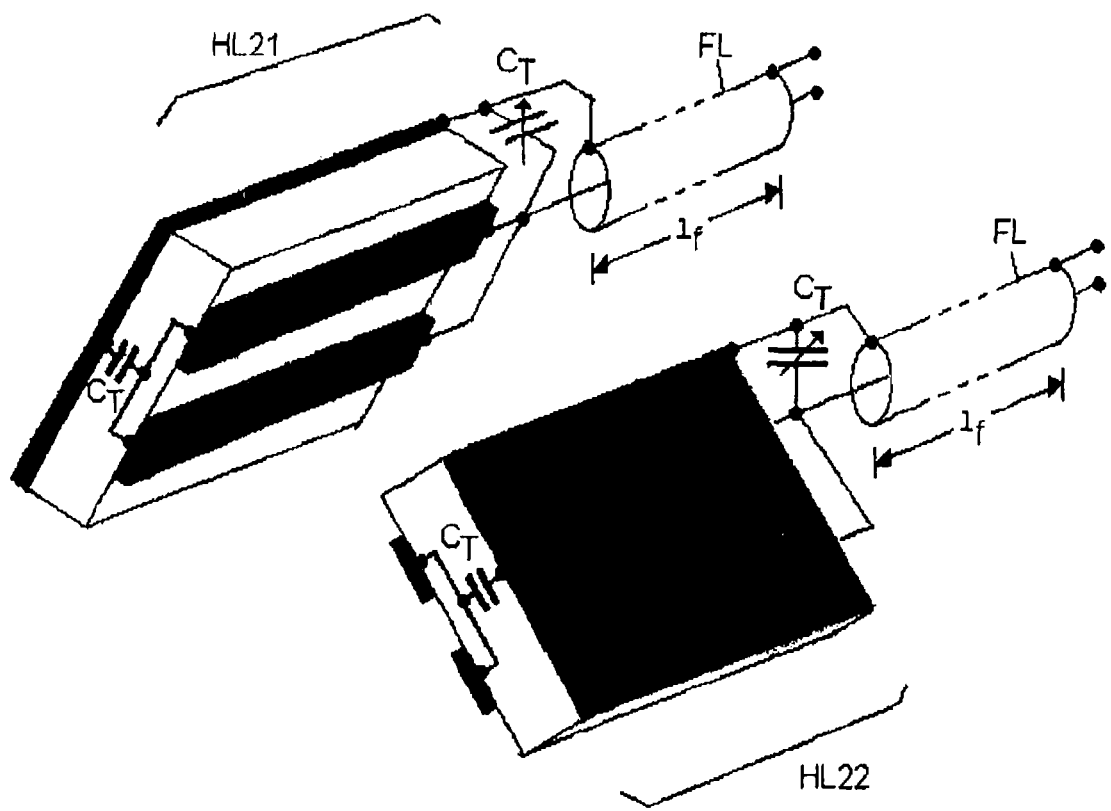
FIG. 14 shows an example for the connections of the label antenna according to FIG. 12.

FIG. 14 schematically represents an example for the electrical connection manner of label antenna 2 shown in FIG. 12. Each of strip lines HL21, HL22 is terminated on both ends preferably with equally large tuning condensers $C_T$. These condensers are advantageously selected in such a manner that the arrangement at the feeding point, that is, at the connection point for the HF transmitter for the magnetic marking of the blood behaves like a parallel oscillating circuit. In this configuration a current maximum is obtained in the middle of the strip line that drops off slightly toward both ends. The supply of the HF power to the feeding points takes place via coaxial feed lines FL, whose electrical length $l_f$ is preferably an odd multiple m>=1 of a quarter wavelength $\lambda/4$:

$$l_f = \lambda/4 * (1+2n), \text{ with } n=0, 1, 2, \ldots$$

If the blood in all carotid arteries is to be magnetically marked, both strip lines HL21, HL22 label antenna 2 are connected to one another in parallel. For a deeper penetration depth of the magnetic field at angles between the surface normals of both strip conductors greater than approximately 120° the control purposefully takes place with a phase difference of 180°. The contributions of both strip lines HL21, HL22 to the magnetic field are then summed in the depth.

If the marking is to take place only by means of one strip line, that is, only the carotid artery of the left or the right side is to be magnetically marked, only the desired line is connected and the other line then remains open at the feeding point. If feed lines FL have the above-named length $l_f$, an open input then results in the short-circuiting of tuning condenser $C_T$ on the other end of the line and the detuning of the corresponding HF strip line.

Note that the relative position of both strip conductors can be adapted to the anatomical conditions of the test subject or patient. This is achieved, e.g., by a flexible band into which both strip conductors are worked. This band is then applied to the neck of the test subject or patient. The angle between the surface normals of the strip conductors can vary from 180° (anti-parallel position) to approximately 60°. The coupling between both strip lines remains slight in all instances.

In the following, different variants of a CASL process for the perfusion measuring of a helmet antenna 1 and a label antenna 2 with the arrangement shown in FIG. 12 are described. Both antennas 1 and 2 are connected independently of one another to a transmitter and a receiver via their own HF transmission channel. Alternatively, it is also possible to use a single channel and to switch it rapidly back and forth for an alternating operation of both antennas. The head of the test subject or patient is surrounded by helmet antenna 1. This helmet antenna is tuned via the tuning- and matching network to the $^1H$ resonance frequency at the corresponding magnetic field strength $B_0$ of the main field. Label antenna 2 is positioned on the neck of the test subject or patient. This antenna is also tuned to the $^1H$ resonance frequency.

In a first variant only one strip line of label antenna 1 is tuned, either only line HL21 or only line HL22 in order to selectively mark only the blood in the right or the left carotid artery. Feed line FL of the other strip line is terminated open in this case. In the second variant the two strip lines HL21 and HL22 are connected in order to mark the blood of the left as well as of the right carotid and vertebral arteries. Strip lines HL21, HL22 on the left and on the right are controlled thereby with HF power phase-shifted by 180° in order to increase the penetration depth of the magnetic field.

Since the coupling between a helmet antenna 1 in accordance with the invention and label antenna 2 is negligibly small on account of the primarily transversal alignment of the magnetic field in both antennas, no measures for the electronic decoupling of the two antennas are necessary.

It is pointed out here that the described arrangement permits an extremely high degree of flexibility for perfusion measuring. Thus, the arteries of only the left or the right side or all arteries can be selectively magnetically marked. Moreover, when using a local gradient coil the imaging can be viewed as completely independent of the magnetic marking procedure. Thus, a magnetic marking during the imaging, that is, the simultaneous operating of both antennas, is possible, which achieves the maximally possible resolution in time of the perfusion measuring as well as the maximally possible sensitivity. This simultaneity of the operation of both antennas can not be achieved with the previously available, electronically decoupled systems.

Note that the described CASL process can also be used with an antenna combination designed in accordance with the invention even for examining the perfusion in other body regions, wherein the antennas are to be adapted to the anatomical conditions of the region concerned. It is also possible to implement antenna combinations designed in accordance with the invention for examinations analogous to CASL on other objects. In all instances the tuning can also take place on the magnetic resonance of types of nuclei other than $^1$H.

In the embodiments shown in the figures the bodily structure of the HF lines is constant in all cross sections over the line length both as regards the material as well as regards the cross-sectional geometry. However, this "cross-sectional constancy" can be deviated from in order to additionally vary the field distribution in a location-dependent manner along the line length, as already mentioned further above. Thus, e.g., the width and/or thickness of the strip lines can vary over the line length. If the strip line contains several "inner" conductor strips adjacent to each other, their course can also be other than parallel; the mutual distance of these conductor strips can change in a continuous or stepped manner over the length. A variation of the cross-sectional geometry can also be designed in such a manner that that a gradual transition of the wave resistance of the HF line to the wave resistance of the feed line results.

The examples disclosed in the previous description and in FIGS. 3 to 14 can illustrate that and how it is possible to achieve in a novel manner purposeful field distributions for an optimal selective illumination of a volume area of interest by means of HF lines as magnetic resonance antenna elements. These recognitions can be used, as mentioned above, with the helmet antenna as well as with any label antenna present or required. The latter even has advantages if a conventional design is used for the helmet antenna or for the detection of the spins of any other antenna structure that are "marked" by the label antenna.

In general, these recognitions can be used with every type of HF antennas for magnetic resonance measurings in that the contour of a single or of a plurality of HF lines is adapted in its/their longitudinal direction at least approximately to the particular surface contour of the object to be examined that exists at the destination position of the antenna arrangement, and in that the electrical length, the termination and selected features of the bodily structure (e.g., one or more of the above-indicated parameters) of the or of each HF line are selected or tuned to each other in such a manner that a standing guide wave results in the particular HF line at the magnetic resonance frequency whose magnetic alternating field along the length of the HF line has an intensity profile at which the coupling with the spins of the object to be examined is optimal in the volume area of interest when the particular HF line is at its destination position. This "optimum" may be a strong as possible concentration or focusing of the $B_1$ field strength on the volume area of interest, an intended or a minimal as possible $B_1$ gradient (that is, maximal as possible $B_1$ homogeneity) in this area, or an optimal compromise between these things.

What is claimed is:

1. An antenna system for exciting and/or detecting a magnetic resonance in an object to be examined that is exposed to a main magnetic field that orients spins of the object in a desired longitudinal direction (z), with at least a first antenna structure containing a plurality of conducting sections that are each designed to conduct high-frequency alternating current at a magnetic resonance frequency in the range of approximately 1 MHz to 1 GHz and that extend from a common vertex area spreading out like claws to a base area in order to surround like a helmet a part of the object lo be examined and containing a volume of interest,
   wherein each conducting section is designed as an antenna line for conducting a guided wave propagating in TEM mode or in a quasi TEM mode in electromagnetic coupling with the spins of the object to be examined which is to be surrounded;
   wherein an electrical length and terminations of the antenna lines of the first antenna structure are selected in such a manner that standing waves at the frequency of the magnetic resonance occur in the antenna lines; and
   wherein the electrical length and termination of each antenna line of the first antenna structure is dimensioned such that at the magnetic resonance frequency the magnitude of the alternating current on the antenna line continuously increases from the vertex area to the base area or from both ends towards the middle thereof.

2. The antenna system according to claim 1, characterized by a second antenna structure for exciting the magnetic resonance in a second part of the object to be examined, that contains a second volume of interest, with at least one antenna line for conducting a guided wave propagating in TEM mode or in a quasi TEM mode in electromagnetic coupling with the spins of the second part of the object to be examined.

3. The antenna system according to claim 1, characterized by such a dimensioning of the electrical length, the termination and of parameters of the bodily structure of each antenna line at least of the first antenna structure that the magnetic alternating field of the standing guide wave along the length of the antenna lines has an intensity profile at the magnetic resonance frequency at which the coupling with the spins of the object to be examined is focused on the particular volume area of interest when the particular antenna structure is at its destination position.

4. The antenna system according to claim 1, characterized by such a dimensioning of the electrical length, the termination and of parameters of the bodily structure of each antenna line at least of the first antenna structure that a gradient of a component, measured in said longitudinal direction, of the resulting magnetic alternating field of the guided waves is directed into the volume area of interest when the first antenna structure is at its destination position.

5. The antenna system according to claim 1, characterized by such a dimensioning of the electrical length, the termination and of parameters of the bodily structure of each antenna line at least of the first antenna structure that a gradient of a component, measured in said longitudinal direction, of the resulting magnetic alternating field of the guided waves is minimal over the volume area of interest when the first antenna structure is at its destination position.

6. The antenna system according to claim 1, characterized in that at least one reactive element is provided on or in at least one of the antenna lines in order to achieve the desired electrical length of the particular antenna line at a desired geometric length.

7. The antenna system according to claim 1, characterized in that the antenna lines of at least the first antenna structure are designed as strip lines.

8. The antenna system according to claim 7, characterized in that each antenna line of at least one of the antenna structures comprises at least two conductor strips with a dielectric arranged between them, wherein one of the conductor strips runs as an outer conductor strip on a side of the dielectric that is directed away from the object to be surrounded, and the or every other conductor strip runs as an inner conductor strip on a side of the dielectric that is directed toward the object to be surrounded.

9. The antenna system according to claim 8, characterized in that the dielectric is a dielectric carrier material on whose surfaces the conductor strips are applied.

10. The antenna system according to claim 8, characterized in that the outer conductor strip is slotted in the longitudinal direction in order to suppress eddy currents.

11. The antenna system according to claim 8, characterized in that the width of the or of each inner conductor strip is at the most equal to 20 times the thickness of the dielectric.

12. The antenna system according to claim 8, characterized in that the thickness of each conductor strip is at least equal to the skin depth at the magnetic resonance frequency.

13. The antenna system according to claim 9, characterized in that the outer conductor strip extends on both sides over the width taken up by the inner conductor strip or strips.

14. The antenna system according to claim 8, characterized in that at least two inner conductor strips are provided on at least one of the antenna lines that have coupling connections for the individual coupling in and/or out of RF power on or close to a first end of the antenna line and have end connections on the second end of the antenna line for individual termination relative to the outer conductor strip.

15. The antenna system according to claim 8, characterized in that at least two inner conductor strips are provided on at least one of the antenna lines, and that the inner conductor strips at both ends of the antenna line are short circuited to each other, and that connection means for coupling RF energy in and/or out on the antenna line via a common feed line is provided on or close to a first end of the antenna line.

16. The antenna system according to claim 1, characterized in that each end of at least one of the antenna lines is terminated in the same manner, and that a switching device is provided in order to exchange the second end selectively in its electrical function with the first end.

17. The antenna system according to claim 1, characterized by such a spatial course of the antenna lines of the first antenna structure that they can surround like a helmet at least the part of the head of a test subject that contains a brain.

18. The antenna system according to claim 17, characterized in that the antenna lines of the first antenna structure are terminated with a short circuit on the ends far from the vertex and have an electrical length that is substantially equal to a quarter wavelength λ/4 at the magnetic resonance frequency under loading of the antenna structure by the object to be examined.

19. The antenna system according to claim 17, characterized in that the antenna lines of the first antenna structure are curved starting from the vertex area in the direction of the base area until they achieve an at least approximately parallel alignment with a center axis in the last part of their length.

20. The antenna system according to claim 19, characterized in that the curvature follows an ellipse at least approximately and that a semi-axis of the ellipse coincides with the center axis.

21. The antenna system according to claim 17, characterized in that the second antenna structure is designed to be installed on a neck of a test subject in order to magnetically mark the blood flowing to the brain.

22. The antenna system according to claim 21, characterized in that the second antenna structure contains at least two antenna lines and includes a holding device in order to hold a first antenna line in a position for the magnetic resonance excitation of the blood of the left carotid artery and to hold a second antenna line for the magnetic resonance excitation of the blood of the right carotid artery.

23. The antenna system according to claim 1, characterized in that the first antenna structure contains two pairs of diametrically diverging antenna lines angularly offset by 90° to one another, and that a device is provided for coupling RF power in and/or out on the antenna lines with a relative phase position at which there is a phase difference of 180° between the antenna lines of the same pair and a phase difference of 90° between the two pairs.

24. An antenna system for exciting and/or detecting a magnetic resonance in an object to be examined that is exposed to a main magnetic field that orients spins of the object in a desired longitudinal direction (z), with at least a first antenna structure containing a plurality of conducting sections that are each designed to conduct high-frequency alternating current at a magnetic resonance frequency in the range of approximately 1 MHz to 1 GHz and that extend from a common vertex area spreading out like claws to a base area in order to surround like a helmet a part of the object to be examined and containing a volume of interest, wherein each conducting section is designed as an antenna line for conducting a guided wave propagating in TEM mode or in a quasi TEM mode in electromagnetic coupling with the spins of the object to be examined which is to be surrounded;

wherein an electrical length and terminations of the antenna lines of the first antenna structure are selected in such a manner that standing waves at the frequency of the magnetic resonance result in the antenna lines; and wherein dimensioning of the electrical length and of the termination of each antenna line of the first antenna structure is such that at the magnetic resonance frequency the magnitude of the alternating current on the antenna line continuously increases from the vertex area to the base area.

25. An antenna system for exciting and/or detecting a magnetic resonance in an object to be examined that is exposed to a main magnetic field that orients spins of the object in a desired longitudinal direction (z), with at least a first antenna structure containing a plurality of conducting sections that are each designed to conduct high-frequency alternating current at a magnetic resonance frequency in the range of approximately 1 MHz to 1 GHz and that extend from a common vertex area spreading out like claws to a base area in order to surround like a helmet a part of the object to be examined and containing a volume of interest, wherein each conducting section is designed as an antenna line for conducting a guide wave propagating in TEM mode or in a quasi TEM mode in electromagnetic coupling with the spins of the object to be examined which is to be surrounded, wherein an electrical length and terminations of the antenna lines are selected in such a manner that standing waves at the frequency of the magnetic resonance occur in the antenna lines;

wherein a spatial course of the antenna lines of the first antenna structure can surround like a helmet at least the part of the head of a test subject that contains a brain; and wherein a second antenna structure is designed to be installed on a neck of a test, subject in order to magnetically mark the blood flowing to the brain;

wherein a dimensioning of the electrical length and of the termination of the or of each antenna line of the second antenna structure is such that the magnitude of the alternating current on the antenna lines continuously increases from both ends towards the middle at the magnetic resonance frequency.

* * * * *